US012633944B2

(12) United States Patent
Gu et al.

(10) Patent No.: US 12,633,944 B2
(45) Date of Patent: May 19, 2026

(54) ENCODING METHOD AND ENCODING APPARATUS BASED ON POLAR CODE

(71) Applicant: HUAWEI TECHNOLOGIES CO., LTD., Shenzhen (CN)

(72) Inventors: Jiaqi Gu, Shenzhen (CN); Mengyao Ma, Shenzhen (CN); Jiahui Li, Shenzhen (CN); Zihan Tang, Shenzhen (CN); Wei Lin, Shenzhen (CN); Yinggang Du, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/806,832

(22) Filed: Aug. 16, 2024

(65) Prior Publication Data

US 2024/0405786 A1 Dec. 5, 2024

Related U.S. Application Data

(63) Continuation of application No. PCT/CN2023/072437, filed on Jan. 16, 2023.

(30) Foreign Application Priority Data

Feb. 17, 2022 (CN) .......................... 202210148372.3

(51) Int. Cl.
H03M 13/00 (2006.01)
H03M 7/32 (2006.01)
H03M 13/13 (2006.01)

(52) U.S. Cl.
CPC ......... *H03M 13/13* (2013.01); *H03M 7/3011* (2013.01)

(58) Field of Classification Search
CPC ... H04L 1/0057; H04L 1/0046; H04L 1/0047; H04L 1/0076
See application file for complete search history.

(56) References Cited

U.S. PATENT DOCUMENTS 9,479,291 B2 * 10/2016 Mahdavifar .......... H04L 1/0041
9,530,230 B2 * 12/2016 Conlon ................... G06T 11/40
10,454,499 B2 * 10/2019 Richardson ......... H03M 13/616
(Continued)

OTHER PUBLICATIONS

V. Kostina and S. Verdu, Fixed-length lossy compression in the finite block length regime, IEEE Transactions on Information Theory, vol. 58, No. 6, pp. 3309-3338, Jun. 2012, total 30 pages.
(Continued)

*Primary Examiner* — Esaw T Abraham

(57) ABSTRACT

This application provides an encoding method and an encoding apparatus based on a polar code, to improve compression performance of a source sequence of a limited length. The method includes: obtaining a source bit sequence; encoding the source bit sequence by using a polar code generation matrix that is based on sub-block column transformation, to obtain a first bit sequence, where the polar code generation matrix is determined based on a first polar code generation matrix and a transformation matrix, and the transformation matrix may achieve effect of performing sub-block column transformation on the first polar code generation matrix; and compressing the first bit sequence, to obtain a compressed bit sequence.

20 Claims, 11 Drawing Sheets

<u>100</u>

(56) References Cited

U.S. PATENT DOCUMENTS

| | | | | |
|---|---|---|---|---|
| 10,897,329 B2 * | 1/2021 | Ahn | ....................... | H04L 1/1812 |
| 11,095,397 B2 * | 8/2021 | Jang | ...................... | H04L 1/0041 |
| 11,496,156 B2 * | 11/2022 | Chen | ................. | H03M 13/6362 |
| 2014/0040214 A1 | 2/2014 | Ma | | |
| 2019/0312681 A1 | 10/2019 | Luo et al. | | |

OTHER PUBLICATIONS

Wang Runxin et al: "FV polar coding for lossy compression with an improved exponent", 2015 IEEE International Symposium on Information Theory (ISIT), IEEE, Jun. 14, 2015 (Jun. 14, 2015), XP033220027, total 5 pages.
Arikan Erdal Ed-Amin Moeness G et al: "Entropy polarization in butterfly transforms", Digital Signal Processing, Academic Press, Orlando, FL, US vol. 119, Aug. 18, 2021 (Aug. 18, 2021), XP086863957, total 8 pages.

* cited by examiner

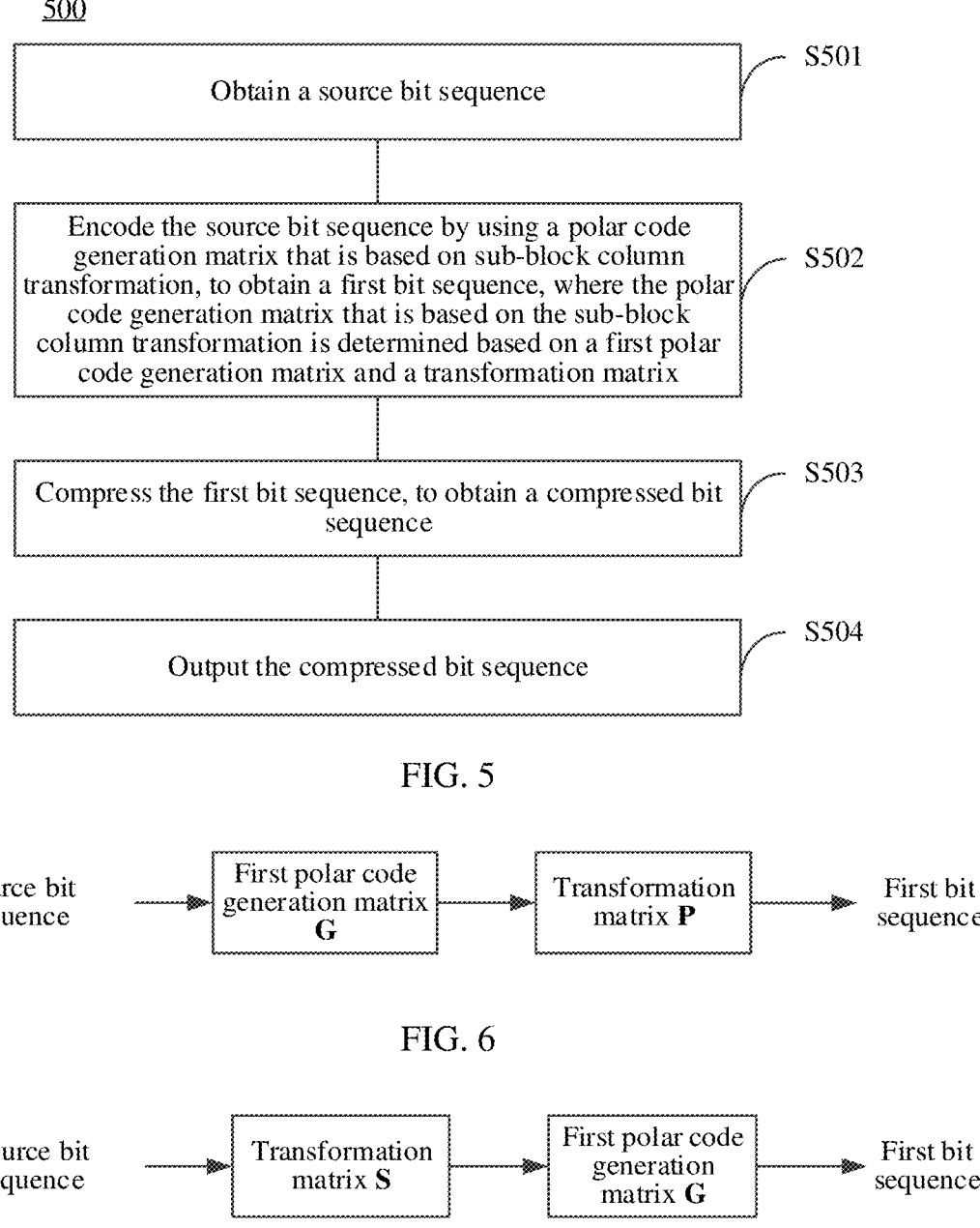

500

Obtain a source bit sequence — S501

Encode the source bit sequence by using a polar code generation matrix that is based on sub-block column transformation, to obtain a first bit sequence, where the polar code generation matrix that is based on the sub-block column transformation is determined based on a first polar code generation matrix and a transformation matrix — S502

Compress the first bit sequence, to obtain a compressed bit sequence — S503

Output the compressed bit sequence — S504

FIG. 5

Source bit sequence → First polar code generation matrix G → Transformation matrix P → First bit sequence

FIG. 6

Source bit sequence → Transformation matrix S → First polar code generation matrix G → First bit sequence

FIG. 7

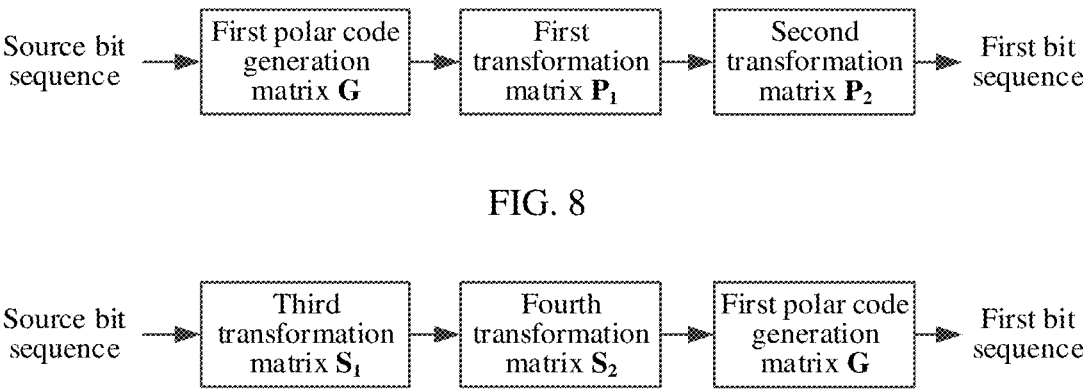
FIG. 8
FIG. 9
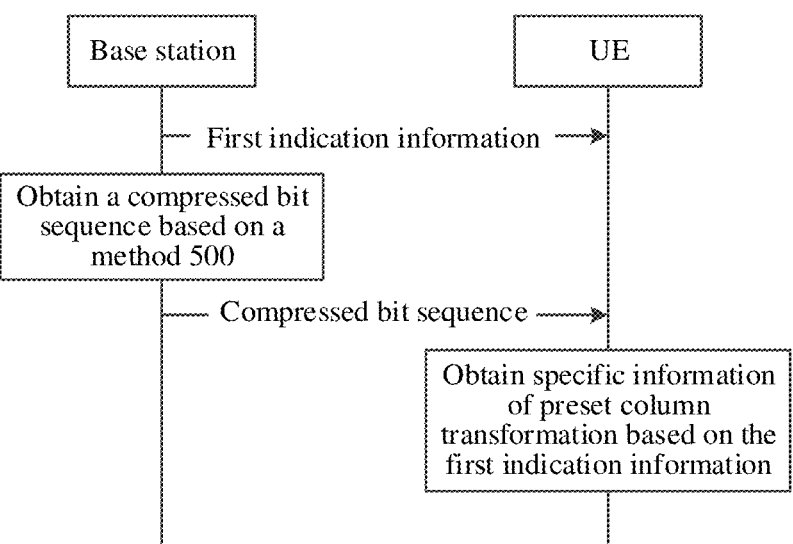
FIG. 10

ENCODING METHOD AND ENCODING APPARATUS BASED ON POLAR CODE

CROSS-REFERENCE TO RELATED APPLICATIONS

This application is a continuation of International Application No. PCT/CN2023/072437, filed on Jan. 16, 2023, which claims priority to Chinese Patent Application No. 202210148372.3, filed on Feb. 17, 2022. The disclosures of the aforementioned applications are hereby incorporated by reference in their entireties.

TECHNICAL FIELD

This application relates to the field of data encoding technologies, and in particular, to an encoding method and an encoding apparatus based on a polar code.

BACKGROUND

In a communication system, a channel is usually encoded by using a polar code, to improve reliability of data transmission and ensure communication quality. Research shows that, in the communication system, a source may also be encoded by using the polar code, to implement source compression.

When the source is encoded by using the polar code, it can be theoretically proved that, when a length of a source sequence tends to be infinite, the source compression may reach a compression limit, in other words, lossless compression is implemented. However, in an actual application scenario, the length of the source sequence is limited. In this case, the lossless compression cannot be implemented for the source compression implemented by encoding the source by using the polar code, and compression performance is poor.

Therefore, an encoding method based on the polar code is urgently needed to improve the compression performance of the source sequence of the limited length.

SUMMARY

This application provides an encoding method and an encoding apparatus based on a polar code, to improve compression performance of a source sequence of a limited length.

According to a first aspect, an encoding method based on a polar code is provided. The method includes: obtaining a source bit sequence; encoding the source bit sequence by using a polar code generation matrix that is based on sub-block column transformation, to obtain a first bit sequence, where the polar code generation matrix that is based on the sub-block column transformation is determined based on a first polar code generation matrix and a transformation matrix, and the transformation matrix may achieve an effect of performing sub-block column transformation on the first polar code generation matrix; and compressing the first bit sequence, to obtain a compressed bit sequence.

The polar code generation matrix that is based on the sub-block column transformation may mean that there is a submatrix on which column transformation is performed in a polar code generation matrix, and a polar code generation matrix obtained through the column transformation is a polar code generation matrix that is based on sub-block column transformation.

The sub-block column transformation may be understood as that column transformation is performed on a submatrix. To be specific, the transformation matrix may enable the column transformation to be performed on a submatrix in the first polar code generation matrix, to obtain the polar code generation matrix that is based on the sub-block column transformation. A sending device may perform encoding by using the polar code generation matrix that is based on the sub-block column transformation.

In the encoding method based on a polar code provided in this application, the transformation matrix can enable the column transformation to be performed on the submatrix in the first polar code generation matrix, to obtain the polar code generation matrix that is based on the sub-block column transformation. Encoding is performed by using the polar code generation matrix that is based on the sub-block column transformation, so that a quantity of codewords with a minimum code distance in an original polar code can be reduced, and a code spectrum can be improved. This helps obtain better compression performance. In addition, a length of the source bit sequence is not limited in this manner, and compression performance of a source sequence of a limited length can be improved.

With reference to the first aspect, in some implementations of the first aspect, the encoding the source bit sequence by using a polar code generation matrix that is based on sub-block column transformation, to obtain a first bit sequence includes: encoding the source bit sequence based on the first polar code generation matrix, to obtain a second bit sequence; and transforming the second bit sequence based on the transformation matrix, to obtain the first bit sequence.

With reference to the first aspect, in some implementations of the first aspect, the transformation matrix P is expressed as the following formula:

$$P = \begin{bmatrix} (G_{N/2})_{permute} \cdot G_{N/2} & 0 \\ 0 & I \end{bmatrix}^{-1},$$

where $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

With reference to the first aspect, in some implementations of the first aspect, the transformation matrix P is obtained by using a matrix S, P=G·S·G, G is a first polar code generation matrix, and the matrix S is expressed as the following formula:

$$S = \begin{bmatrix} G_{N/2} \cdot (G_{N/2})_{permute} & 0 \\ I = G_{N/2} \cdot (G_{N/2})_{permute} & I \end{bmatrix}^{-1},$$

where $G_{N/2}$ is the second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through the first preset column transformation of $G_{N/2}$, 0 is the zero matrix of N/2×N/2, and I is the unit matrix of N/2×N/2.

With reference to the first aspect, in some implementations of the first aspect, the transformation matrix includes a first transformation matrix and a second transformation matrix; and the transforming the second bit sequence based on the transformation matrix, to obtain the first bit sequence includes: transforming the second bit sequence based on the first transformation matrix, to obtain a third bit sequence; and transforming the third bit sequence based on the second transformation matrix, to obtain the first bit sequence, where the first transformation matrix and the second transformation matrix may achieve the effect of performing sub-block column transformation on the first polar code generation matrix.

With reference to the first aspect, in some implementations of the first aspect, the first transformation matrix $P_1$ is expressed as the following formula:

$$P_1 = \begin{bmatrix} A & 0 \\ 0 & B \end{bmatrix}^{-1}, \text{ where}$$

$$A = \begin{bmatrix} (G_{N/4})_{permute1} & G_{N/4} & 0 \\ 0 & & I \end{bmatrix},$$

$$B = \begin{bmatrix} (G_{N/4})_{permute2} & G_{N/4} & 0 \\ 0 & & I \end{bmatrix},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is a matrix obtained through second preset column transformation of $G_{N/4}$, $(G_{N/4})_{permute2}$ is a matrix obtained through third preset column transformation of $G_{N/4}$, 0 is a zero matrix, and I is a unit matrix of N/4×N/4.

With reference to the first aspect, in some implementations of the first aspect, the second transformation matrix $P_2$ is expressed as the following formula:

$$P_2 = \begin{bmatrix} C & 0 \\ 0 & I \end{bmatrix}^{-1}, \text{ where}$$

$$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},$$

$$\begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, 0 is the zero matrix, and I is a unit matrix of N/2×N/2.

With reference to the first aspect, in some implementations of the first aspect, the first transformation matrix $P_1$ and the second transformation matrix $P_2$ are obtained by using a matrix $S_1$ and a matrix $S_2$, $P_1 \cdot P_2 = G \cdot S_1 \cdot S_2 \cdot G$, G is the first polar code generation matrix, and the matrix $S_1$ is expressed as the following formula:

$$S_1 = \begin{bmatrix} D & 0 \\ I - D & I \end{bmatrix}^{-1}, \text{ where}$$

$$D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{premute1}$ is the matrix obtained through the second preset column transformation of $G_{N/4}$, $$\begin{bmatrix} (G_{N/4})_{permute1} & 0 \\ G_{N/4} & G_{N/4} \end{bmatrix}_{permute3}$$

is the matrix obtained through the fourth preset column transformation of $$\begin{bmatrix} (G_{N/4})_{permute1} & 0 \\ G_{N/4} & G_{N/4} \end{bmatrix},$$

0 is the zero matrix, and I is a unit matrix; and the matrix $S_2$ is expressed as the following formula:

$$S_2 = \begin{bmatrix} J & 0 \\ K & M \end{bmatrix}^{-1}, \text{ where}$$

$$J = \begin{bmatrix} G_{N/4} \cdot (G_{N/4})_{permute1} & 0 \\ I - G_{N/4} \cdot (G_{N/4})_{permute1} & I \end{bmatrix},$$

$$K = \begin{bmatrix} G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0 \end{bmatrix},$$

$$M = \begin{bmatrix} G_{N/4} \cdot (G_{N/4})_{permute2} & 0 \\ I - G_{N/4} \cdot (G_{N/4})_{permute2} & I \end{bmatrix},$$

and $(G_{N/4})_{permute2}$ is the matrix obtained through the third preset column transformation of $G_{N/4}$.

With reference to the first aspect, in some implementations of the first aspect, the encoding the source bit sequence by using a polar code generation matrix that is based on sub-block column transformation, to obtain a first bit sequence includes: transforming the source bit sequence based on the transformation matrix, to obtain a fourth bit sequence; and encoding the fourth bit sequence based on the first polar code generation matrix, to obtain the first bit sequence.

With reference to the first aspect, in some implementations of the first aspect, the transformation matrix S is expressed as the following formula:

$$S = \begin{bmatrix} G_{N/2} \cdot (G_{N/2})_{permute} & 0 \\ G_{N/2} \cdot (G_{N/2})_{permute} & I \end{bmatrix}^{-1},$$

where $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

5

6

With reference to the first aspect, in some implementations of the first aspect, the transformation matrix S is obtained by using a matrix P, S=G·P·G, G is the first polar code generation matrix, and the matrix P is expressed as the following formula:

$$P = \begin{bmatrix} (G_{N/2})_{permute} \cdot G_{N/2} & 0 \\ 0 & I \end{bmatrix}^{-1},$$

where $G_{N/2}$ is the second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through the first preset column transformation of $G_{N/2}$, 0 is the zero matrix of N/2×N/2, and I is the unit matrix of N/2×N/2.

With reference to the first aspect, in some implementations of the first aspect, the transformation matrix includes a third transformation matrix and a fourth transformation matrix; and the transforming the source bit sequence based on the transformation matrix, to obtain a fourth bit sequence includes: transforming the source bit sequence based on the third transformation matrix, to obtain a fifth bit sequence; and transforming the fifth bit sequence based on the fourth transformation matrix, to obtain the fourth bit sequence, where the third transformation matrix and the fourth transformation matrix may achieve the effect of performing sub-block column transformation on the first polar code generation matrix.

With reference to the first aspect, in some implementations of the first aspect, the third transformation matrix $S_1$ is expressed as the following formula:

$$S_1 = \begin{bmatrix} D & 0 \\ I-D & I \end{bmatrix}^{-1}, \text{where}$$

$$D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{premute1}$ is a matrix obtained through second preset column transformation of $$G_{N/4}, \begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix},$$

0 is a zero matrix, and I is a unit matrix of N/2×N/2.

With reference to the first aspect, in some implementations of the first aspect, the fourth transformation matrix $S_2$ is expressed as the following formula:

$$S_2 = \begin{bmatrix} J & 0 \\ K & M \end{bmatrix}^{-1}, \text{where}$$

-continued $$J = \begin{bmatrix} G_{N/4} \cdot (G_{N/4})_{permute1} & 0 \\ I - G_{N/4} \cdot (G_{N/4})_{permute1} & I \end{bmatrix},$$

$$K = \begin{bmatrix} G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0 \end{bmatrix},$$

$$M = \begin{bmatrix} G_{N/4} \cdot (G_{N/4})_{permute2} & 0 \\ I - G_{N/4} \cdot (G_{N/4})_{permute2} & I \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, $(G_{N/4})_{permute2}$ is a matrix obtained through third preset column transformation of $G_{N/4}$, 0 is the zero matrix, and I is a unit matrix of N/4×N/4.

With reference to the first aspect, in some implementations of the first aspect, the third transformation matrix $S_1$ and the fourth transformation matrix $S_2$ are obtained by using a matrix P and a matrix $P_2$, $S_1 \cdot S_2 = G \cdot P_1 \cdot P_2 \cdot G$, G is a first polar code generation matrix, and the matrix $P_1$ is expressed as the following formula:

$$P_1 = \begin{bmatrix} A & 0 \\ 0 & B \end{bmatrix}^{-1}, \text{where}$$

$$A = \begin{bmatrix} (G_{N/4})_{permute1} \cdot G_{N/4} & 0 \\ 0 & I \end{bmatrix},$$

$$B = \begin{bmatrix} (G_{N/4})_{permute2} \cdot G_{N/4} & 0 \\ 0 & I \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, $(G_{N/4})_{permute2}$ is the matrix obtained through the third preset column transformation of $G_{N/4}$, 0 is the zero matrix, and I is a unit matrix; and the matrix $P_2$ is expressed as the following formula:

$$P_2 = \begin{bmatrix} C & 0 \\ 0 & I \end{bmatrix}^{-1}, \text{where}$$

$$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1}, \text{and}$$

$$\begin{bmatrix} (G_{N/4})_{permute1} & 0 \\ G_{N/4} & G_{N/4} \end{bmatrix}_{permute3}$$

is the matrix obtained through the fourth preset column transformation of $$\begin{bmatrix} (G_{N/4})_{permute1} & 0 \\ G_{N/4} & G_{N/4} \end{bmatrix}.$$

According to a second aspect, a decoding method based on a polar code is provided. The method includes: obtaining a to-be-decoded bit sequence; decompressing the to-be-decoded bit sequence, to obtain a bit sequence that is not compressed; and decoding, by using an inverse matrix of a polar code generation matrix that is based on sub-block column transformation, the bit sequence that is not compressed, to obtain a source bit sequence, where the polar code generation matrix that is based on the sub-block column transformation is determined based on a first polar code generation matrix and a transformation matrix.

According to a third aspect, an encoding and decoding apparatus based on a polar code is provided. The apparatus includes an obtaining unit, an encoding unit, and a compression unit. The obtaining unit is configured to obtain a source bit sequence. The encoding unit is configured to encode the source bit sequence by using a polar code generation matrix that is based on sub-block column transformation, to obtain a first bit sequence, where the polar code generation matrix that is based on the sub-block column transformation is determined based on a first polar code generation matrix and a transformation matrix, and the transformation matrix may achieve an effect of performing sub-block column transformation on the first polar code generation matrix. The compression unit is configured to compress the first bit sequence, to obtain a compressed bit sequence.

With reference to the third aspect, in some implementations of the third aspect, the encoding apparatus further includes a transform unit. The encoding unit is further configured to encode the source bit sequence based on the first polar code generation matrix, to obtain a second bit sequence. The transform unit is configured to transform the second bit sequence based on the transformation matrix, to obtain the first bit sequence.

With reference to the third aspect, in some implementations of the third aspect, the transformation matrix P is expressed as the following formula:

$$P = \begin{bmatrix} (G_{N/2})_{permute} \cdot G_{N/2} & 0 \\ 0 & I \end{bmatrix}^{-1},$$

where $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

With reference to the third aspect, in some implementations of the third aspect, the transformation matrix P is obtained by using a matrix S, P=G·S·G, G is the first polar code generation matrix, and the matrix S is expressed as the following formula:

$$S = \begin{bmatrix} G_{N/2} \cdot (G_{N/2})_{permute} & 0 \\ I - G_{N/2} \cdot (G_{N/2})_{permute} & I \end{bmatrix}^{-1},$$

where $G_{N/2}$ is the second polar code generation matrix, N/2 represents that the second polar code generation matrix is N/2×N/2-dimensional, N represents that the first polar code generation matrix is N×N-dimensional, $(G_{N/2})$ permute is the matrix obtained through the first preset column transformation of $G_{N/2}$, 0 is the zero matrix of N/2×N/2, and I is the unit matrix of N/2×N/2.

With reference to the third aspect, in some implementations of the third aspect, the transformation matrix includes a first transformation matrix and a second transformation matrix. The transform unit is further configured to: transform the second bit sequence based on the first transformation matrix, to obtain a third bit sequence; and transform the third bit sequence based on the second transformation matrix, to obtain the first bit sequence, where the first transformation matrix and the second transformation matrix may achieve the effect of performing sub-block column transformation on the first polar code generation matrix.

With reference to the third aspect, in some implementations of the third aspect, the first transformation matrix $P_1$ is expressed as the following formula:

$$P_1 = \begin{bmatrix} A & 0 \\ 0 & B \end{bmatrix}^{-1}, \text{ where}$$

$$A = \begin{bmatrix} (G_{N/4})_{permute1} \cdot G_{N/4} & 0 \\ 0 & I \end{bmatrix},$$

$$B = \begin{bmatrix} (G_{N/4})_{permute2} \cdot G_{N/4} & 0 \\ 0 & I \end{bmatrix},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is a matrix obtained through second preset column transformation of $G_{N/4}$, $(G_{N/4})_{permute2}$ is a matrix obtained through third preset column transformation of $G_{N/4}$, 0 is a zero matrix, and I is a unit matrix of N/4×N/4.

With reference to the third aspect, in some implementations of the third aspect, the second transformation matrix $P_2$ is expressed as the following formula:

$$P_2 = \begin{bmatrix} C & 0 \\ 0 & I \end{bmatrix}^{-1}, \text{ where}$$

$$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},$$

$$\begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix}$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, 0 is the zero matrix, and I is a unit matrix of N/2×N/2.

With reference to the third aspect, in some implementations of the third aspect, the first transformation matrix $P_1$ and the second transformation matrix $P_2$ are obtained by using a matrix $S_1$ and a matrix $S_2$, $P_1 \cdot P_2 = G \cdot S_1 \cdot S_2 \cdot G$, G is the first polar code generation matrix, and the matrix $S_1$ is expressed as the following formula:

$$S_1 = \begin{bmatrix} D & 0 \\ I-D & I \end{bmatrix}^{-1}, \text{ where}$$

$$D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{premute1}$ is the matrix obtained through the second preset column transformation of $G_{N/4}$, $$\begin{bmatrix} (G_{N/4})_{permute1} & 0 \\ G_{N/4} & G_{N/4} \end{bmatrix}_{permute3}$$

is the matrix obtained through the fourth preset column transformation of $$\begin{bmatrix} (G_{N/4})_{permute1} & 0 \\ G_{N/4} & G_{N/4} \end{bmatrix},$$

0 is the zero matrix, and I is a unit matrix; and the matrix $S_2$ is expressed as the following formula:

$$S_2 = \begin{bmatrix} J & 0 \\ K & M \end{bmatrix}^{-1}, \text{ where}$$

$$J = \begin{bmatrix} G_{N/4} \cdot (G_{N/4})_{permute1} & 0 \\ I - G_{N/4} \cdot (G_{N/4})_{permute1} & I \end{bmatrix},$$

$$K = \begin{bmatrix} G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0 \end{bmatrix},$$

$$M = \begin{bmatrix} G_{N/4} \cdot (G_{N/4})_{permute2} & 0 \\ I - G_{N/4} \cdot (G_{N/4})_{permute2} & I \end{bmatrix},$$

and $(G_{N/4})_{permute2}$ is the matrix obtained through the third preset column transformation of $G_{N/4}$.

With reference to the third aspect, in some implementations of the third aspect, the apparatus further includes a transform unit. The transform unit is configured to transform the source bit sequence based on the transformation matrix, to obtain a fourth bit sequence. The encoding unit is further configured to encode the fourth bit sequence based on the first polar code generation matrix, to obtain the first bit sequence.

With reference to the third aspect, in some implementations of the third aspect, the transformation matrix S is expressed as the following formula:

$$S = \begin{bmatrix} G_{N/2} \cdot (G_{N/2})_{permute} & 0 \\ I - G_{N/2} \cdot (G_{N/2})_{permute} & I \end{bmatrix}^{-1},$$

where $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

With reference to the third aspect, in some implementations of the third aspect, the transformation matrix S is obtained by using a matrix P, S=G·P·G, G is the first polar code generation matrix, and the matrix P is expressed as the following formula:

$$P = \begin{bmatrix} (G_{N/2})_{permute} \cdot G_{N/2} & 0 \\ 0 & I \end{bmatrix}^{-1},$$

where $G_{N/2}$ is the second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through the first preset column transformation of $G_{N/2}$, 0 is the zero matrix of N/2×N/2, and I is the unit matrix of N/2×N/2.

With reference to the third aspect, in some implementations of the third aspect, the transformation matrix includes a third transformation matrix and a fourth transformation matrix. The transform unit is further configured to: transform the source bit sequence based on the third transformation matrix, to obtain a fifth bit sequence; and transform the fifth bit sequence based on the fourth transformation matrix, to obtain the fourth bit sequence, where the third transformation matrix and the fourth transformation matrix may achieve the effect of performing sub-block column transformation on the first polar code generation matrix.

With reference to the third aspect, in some implementations of the third aspect, the third transformation matrix $S_1$ is expressed as the following formula:

$$S_1 = \begin{bmatrix} D & 0 \\ I-D & I \end{bmatrix}^{-1},$$

where $$D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{premute1}$ is a matrix obtained through second preset column transformation of $G_{N/4}$, $$\begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix},$$

0 is a zero matrix, and I is a unit matrix of N/2×N2.

With reference to the third aspect, in some implementations of the third aspect, the fourth transformation matrix $S_2$ is expressed as the following formula:

$$S_2 = \begin{bmatrix} J & 0 \\ K & M \end{bmatrix}^{-1},$$

-continued where $$J = \begin{bmatrix} G_{N/4} \cdot (G_{N/4})_{permute1} & 0 \\ I - G_{N/4} \cdot (G_{N/4})_{permute1} & I \end{bmatrix},$$

$$K = \begin{bmatrix} G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0 \end{bmatrix},$$

$$M = \begin{bmatrix} G_{N/4} \cdot (G_{N/4})_{permute2} & 0 \\ I - G_{N/4} \cdot (G_{N/4})_{permute2} & I \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, $(G_{N/4})_{permute2}$ is a matrix obtained through third preset column transformation of $G_{N/4}$, 0 is the zero matrix, and I is a unit matrix of N/4×N/4.

With reference to the third aspect, in some implementations of the third aspect, the third transformation matrix $S_1$ and the fourth transformation matrix $S_2$ are obtained by using a matrix $P_1$ and a matrix $P_2$, $S_1 \cdot S_2 = G \cdot P_1 \cdot P_2 \cdot G$, G is the first polar code generation matrix, and the matrix $P_1$ is expressed as the following formula:

$$P_1 = \begin{bmatrix} A & 0 \\ 0 & B \end{bmatrix}^{-1},$$

where $$A = \begin{bmatrix} (G_{N/4})_{permute1} \cdot G_{N/4} & 0 \\ 0 & I \end{bmatrix},$$

$$B = \begin{bmatrix} (G_{N/4})_{permute2} \cdot G_{N/4} & 0 \\ 0 & I \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, $(G_{N/4})_{permute2}$ is the matrix obtained through the third preset column transformation of $G_{N/4}$, 0 is the zero matrix, and I is a unit matrix; and the matrix $P_2$ is expressed as the following formula:

$$P_2 = \begin{bmatrix} C & 0 \\ 0 & I \end{bmatrix}^{-1},$$

where $$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},$$

and $$\begin{bmatrix} (G_{N/4})_{permute1} & 0 \\ G_{N/4} & G_{N/4} \end{bmatrix}_{permute3}$$

is the matrix obtained through the fourth preset column transformation of $$\begin{bmatrix} (G_{N/4})_{permute1} & 0 \\ G_{N/4} & G_{N/4} \end{bmatrix}.$$

According to a fourth aspect, an encoding and decoding apparatus based on a polar code is provided, including an obtaining unit, a decompression unit, and a decoding unit. The obtaining unit is configured to obtain a to-be-decoded bit sequence. The decompression unit is configured to decompress the to-be-decoded bit sequence, to obtain a bit sequence that is not compressed. The decoding unit is configured to decode, by using an inverse matrix of a polar code generation matrix that is based on sub-block column transformation, the bit sequence that is not compressed, to obtain a source bit sequence, where the polar code generation matrix based on sub-block column transformation is determined based on a first polar code generation matrix and a transformation matrix.

According to a fifth aspect, an encoding and decoding apparatus based on a polar code is provided, including a processor and a memory. The memory is configured to store a computer program, and the processor is configured to invoke the computer program from the memory and run the computer program, so that the apparatus performs the method in any one of the possible implementations of the first aspect or the method in the second aspect.

Optionally, there are one or more processors, and there are one or more memories.

Optionally, the memory may be integrated with the processor, or the memory and the processor are separately disposed.

Optionally, the encoding apparatus further includes a transmitter and a receiver. The transmitter and the receiver may be separately disposed, or may be integrated together, and are referred to as a transceiver.

According to a sixth aspect, this application provides a processor, including an input circuit, an output circuit, and a processing circuit. The processing circuit is configured to: receive a signal by using the input circuit, and transmit the signal by using the output circuit, so that the processor performs the method in any one of the possible implementations of the first aspect or the method in the second aspect.

In a specific implementation process, the processor may be a chip, the input circuit may be an input pin, the output circuit may be an output pin, and the processing circuit may be a transistor, a gate circuit, a trigger, various logic circuits, or the like. An input signal received by the input circuit may be received and input by, for example, but not limited to, a receiver, a signal output by the output circuit may be output to, for example, but not limited to, a transmitter and transmitted by the transmitter, and the input circuit and the output circuit may be a same circuit, where the circuit is used as the input circuit and the output circuit at different moments. Specific implementations of the processor and various circuits are not limited in this application.

According to a seventh aspect, a computer-readable storage medium is provided. The computer-readable storage medium stores a computer program (which may also be referred to as code or instructions). When the computer program is run on a computer, the computer is enabled to perform the method in any one of the possible implementations of the first aspect or the method in the second aspect.

According to an eighth aspect, a computer program product is provided. The computer program product includes a computer program (which may also be referred to as code or instructions). When the computer program is run, a computer is enabled to perform the method in any one of the possible implementations of the first aspect or the method in the second aspect.

BRIEF DESCRIPTION OF DRAWINGS

FIG. 5 is an example schematic flowchart of an encoding method based on a polar code according to an embodiment of this application;

FIG. 6 is an example schematic block diagram of encoding based on a polar code according to an embodiment of this application;

FIG. 7 is another example schematic block diagram of encoding based on a polar code according to an embodiment of this application;

FIG. 8 is still another example schematic block diagram of encoding based on a polar code according to an embodiment of this application;

FIG. 9 is another example schematic block diagram of encoding based on a polar code according to an embodiment of this application;

FIG. 10 is an example schematic flowchart of determining preset column transformation according to an embodiment of this application;

DESCRIPTION OF EMBODIMENTS

Figure 1:
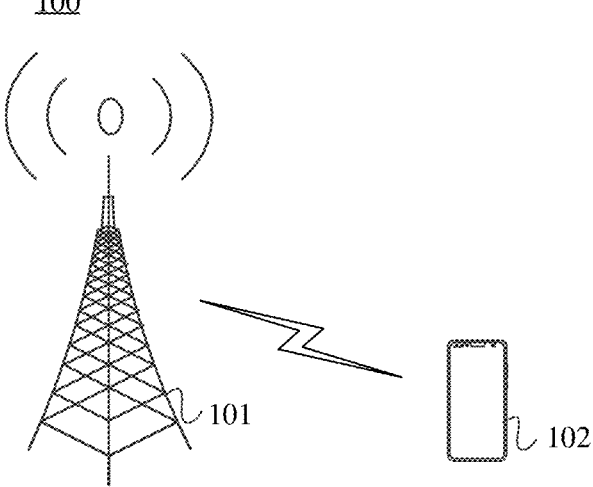
FIG. 1 is a diagram of an example communication system to which an embodiment of this application is applicable.

The following describes technical solutions of this application with reference to accompanying drawings.

The technical solutions in embodiments of this application may be applied to various communication systems, for example, a wireless local area network (WLAN) communication system, a long term evolution (LTE) system, an LTE frequency division duplex (FDD) system, an LTE time division duplex (TDD) system, a 5th generation (5G) mobile communication system, a new radio (NR) system, a worldwide interoperability for microwave access (WiMAX) communication system, or another evolved communication system. The 5G system usually includes the following three major application scenarios: enhanced mobile broadband (eMBB), ultra-reliable and low-latency communication (URLLC), massive machine-type communication (mMTC), and types of communication systems in the future.

A terminal device in embodiments of this application may also be referred to as user equipment (UE), a mobile station (MS), a mobile terminal (MT), an access terminal, a subscriber unit, a subscriber station, a mobile station, a remote station, a remote terminal, a mobile device, a user terminal, a terminal, a wireless communication device, a user agent, a user apparatus, or the like.

The terminal device may be a device that provides voice/data connectivity for a user, for example, a handheld device or a vehicle-mounted device that has a wireless connection function. Currently, examples of some terminals are as follows: a mobile phone, a tablet computer, a notebook computer, a handheld computer, a mobile internet device (MID), a wearable device, a virtual reality (VR) device, an augmented reality (AR) device, a wireless terminal in industrial control, a wireless terminal in self-driving, a wireless terminal in remote medical surgery, a wireless terminal in smart grid (smart grid), a wireless terminal in transportation safety, a wireless terminal in a smart city (smart city), a wireless terminal in a smart home, a cellular phone, a cordless phone, a session initiation protocol (SIP) phone, a wireless local loop (WLL) station, a personal digital assistant (PDA), a handheld device with a wireless communication function, a computing device or another processing device connected to a wireless modem, a vehicle-mounted device, a wearable device, an unmanned aerial vehicle, a terminal device in a 5G network, a terminal device in a future evolved public land mobile network (PLMN), and the like. This is not limited in embodiments of this application.

In addition, in embodiments of this application, the terminal device may alternatively be a terminal device in an internet of things (IoT) system. IoT is an important part of future development of information technologies. A main technical feature of the IoT is connecting a thing to a network by using a communication technology, to implement an intelligent network for interconnection between a person and a machine or between things.

In addition, a network device in embodiments of this application may be a device used to communicate with a terminal device. The network device may also be referred to as an access network device or a wireless access network device, and may be a transmission reception point (TRP), an evolved NodeB (eNB or eNodeB) in an LTE system, a home NodeB (for example, a home evolved NodeB or HNB), a baseband unit (BBU), or a wireless controller in a cloud radio access network (CRAN) scenario. Alternatively, the network device may be a relay station, an access point, a vehicle-mounted device, a wearable device, a network device in a 5G network, a network device in a future evolved PLMN network, or the like; or may be an access point (AP) in a WLAN, a gNB in a new radio (NR) system, a satellite base station in a satellite communication system, a device that undertakes a base station function in various forms, or the like. This is not limited in embodiments of this application.

In a network structure, the network device may include a central unit (CU) node, a distributed unit (DU) node, a RAN device including a CU node and a DU node, or a RAN device including a control plane CU node (CU-CP node), a user plane CU node (CU-UP node), and a DU node.

The network device provides a service for a cell, and a terminal device communicates with the cell by using a transmission resource allocated by the network device (for example, a frequency domain resource or a spectrum resource). The cell may belong to a macro base station (for example, a macro eNB or a macro gNB), or may belong to a base station corresponding to a small cell. The small cell herein may include: a metro cell, a micro cell (micro cell), a pico cell, a femto cell, or the like. These small cells have characteristics of small coverage and low transmit power, and are applicable to providing a high-speed data transmission service.

In embodiments of this application, the terminal device or the network device includes a hardware layer, an operating system layer running on the hardware layer, and an application layer running on the operating system layer. The hardware layer includes hardware such as a central processing unit (CPU), a memory management unit (MMU), and a memory (which is also referred to as a main memory). The operating system may be any one or more types of computer operating systems that implement service processing through a process, for example, a Linux operating system, a Unix operating system, an Android operating system, an iOS operating system, or a windows operating system. The application layer includes applications such as a browser, an address book, word processing software, and instant messaging software. In addition, a specific structure of an execution body of a method provided in embodiments of this application is not particularly limited in embodiments of this application, provided that a program that records code of the method provided in embodiments of this application can be run to perform communication based on the method provided in embodiments of this application. For example, the execution body of the method provided in embodiments of this application may be the terminal device or the network device, or a functional module that can invoke and execute the program in the terminal device or the network device.

In addition, aspects or features of this application may be implemented as a method, an apparatus, or a product that uses standard programming and/or engineering technologies. The term "product" used in this application covers a computer program that can be accessed from any computer-readable component, carrier or medium. For example, the computer-readable medium may include but is not limited to: a magnetic storage component (for example, a hard disk, a floppy disk or a magnetic tape), an optical disc (for example, a compact disc (CD), a digital versatile disc (DVD), a smart card and a flash memory component (for example, erasable programmable read-only memory (EPROM), a card, a stick, or a key drive). In addition, various storage media described in this specification may represent one or more devices and/or other machine-readable media that are configured to store information. The term "machine-readable media" may include but are not limited to a radio channel, and various other media that can store, contain and/or carry instructions and/or data.

For ease of understanding embodiments of this application, a communication system 100 applicable to embodiments of this application is first described in detail with reference to FIG. 1.

The communication system 100 includes a network device 101 and a terminal device 102. The network device 101 may serve as a sending device, to send control information and/or a transport block to the terminal device 102. Alternatively, the terminal device 102 may serve as a sending device, to send control information and/or a transport block to the network device 101. In this scenario, there may be one or more terminal devices. This is not limited in embodiments of this application.

Embodiments of this application may be applied to a plurality of different scenarios, including the scenario shown in FIG. 1, but are not limited to the scenario. For example, for uplink transmission, the terminal device may serve as a sending device, and the network device may serve as a receiving device. For downlink transmission, the network device may serve as a sending device, and the terminal device may serve as a receiving device. For another scenario, for example, in transmission between network devices, one network device may serve as a sending device, and the other network device may serve as a receiving device. For another example, in transmission between terminal devices, one terminal device may serve as a sending device, and the other terminal device may serve as a receiving device. Therefore, the following describes embodiments of this application based on a sending device and a receiving device.

Figure 2:
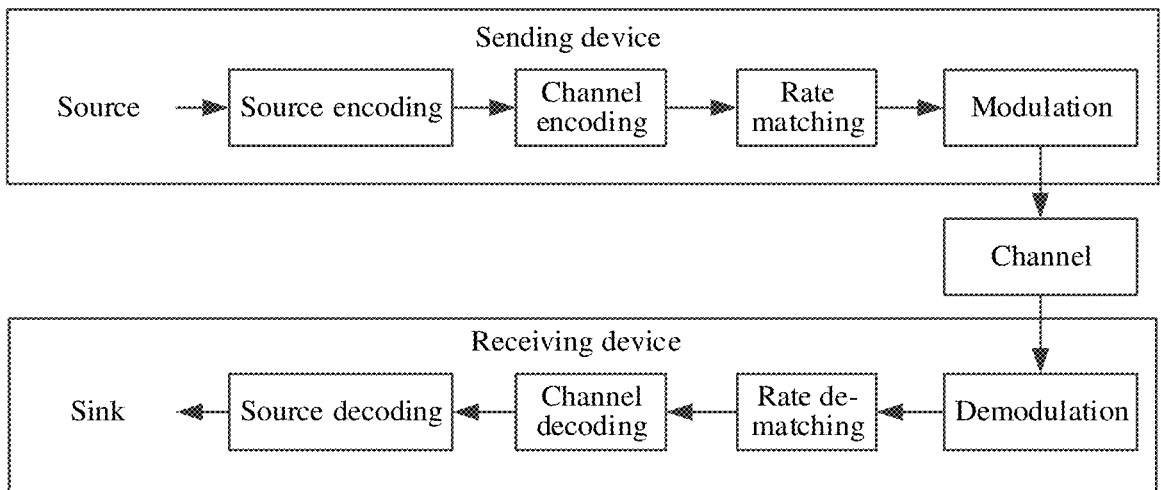
FIG. 2 is a schematic block diagram of an example communication method.

Communication between the sending device and the receiving device may be shown in FIG. 2. After performing source encoding, channel encoding, rate matching, and modulation on a source, the sending device transmits information to the receiving device through a channel. Correspondingly, after receiving the information, the receiving device performs demodulation, rate de-matching, channel decoding, and source decoding on the information, to obtain a sink.

A specific implementation of the channel encoding may be a polar code encoding manner, and the sending device may encode a channel by using a polar code, to improve reliability of data transmission and ensure communication quality. Researches show that a specific implementation of the source encoding may also be a polar code encoding manner, and the sending device may also encode a source by using the polar code, to implement source compression.

When the source is encoded by using the polar code, it can be theoretically proved that, when a length of a source sequence tends to be infinite, the source compression may reach a compression limit, in other words, lossless compression is implemented. However, in an actual application scenario, the length of the source sequence is limited. In this case, the lossless compression cannot be implemented for the source compression implemented by encoding the source by using the polar code, and compression performance is poor.

In view of this, embodiments of this application provide a source encoding method and a source encoding apparatus based on a polar code, to improve compression performance of a source sequence of a limited length.

For ease of understanding of embodiments of this application, the following first describes a polar code encoding manner in embodiments of this application.

1. Polar Code

The polar code is an existing known channel encoding scheme that can be strictly proved to "reach" a channel capacity, and has features such as high performance and low complexity. Currently, the polar code has been determined by the 3rd generation partnership project (3GPP) as a control channel encoding scheme in a 5th generation mobile communication technology (5G) control channel eMBB scenario (uplink/downlink).

2. Polar Code Encoding

A polar code is a type of linear block code, and an encoding process of the polar code may be $x_N = u_N G_N$, where $u_N = \{u_1, u_2, \ldots, u_N\}$ is a binary row vector whose length is N, $G_N = F^{\otimes n}$ is an encoding matrix, $$F = \begin{bmatrix} 1 & 0 \\ 1 & 1 \end{bmatrix},$$

$F^{\otimes n}$ represents a Kronecker power of F, and $F^{\otimes n} = F \otimes F^{\otimes(n-1)}$ may be defined.

In the encoding process of the polar code, $u_N$ may be divided into two parts. A part of bits carry information, and are referred to as information bits, and an index set of these bits may be denoted as A. The other part of bits are fixed values, are referred to as fixed bits, and are usually set to 0. When the fixed bit is set to 0, the encoding process of the polar code may be simplified as $x_A=u_A G_N(A)$, where $u_A$ is an information bit set in $u_N$, and a length of the information bit set may be denoted as K. $G_N(A)$ is a submatrix that includes rows corresponding to indexes in the set A in $G_N$, and $G_N(A)$ is a matrix of K×N. Selection of the set A affects performance of the polar code.

Figure 3:
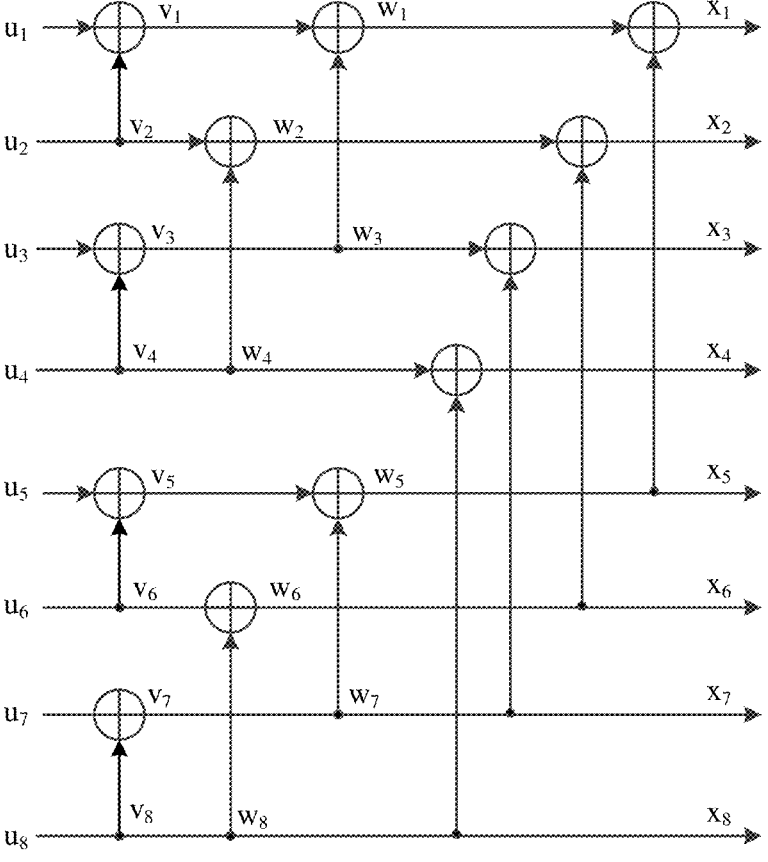
FIG. 3 is an example diagram of polar code encoding.

FIG. 3 is a diagram of polar code encoding. As shown in FIG. 3, $u_8=\{u_1, u_2 \ldots, u_8\}$ is a binary row vector whose length is 8. The binary row vector may include a fixed bit and an information bit, and the fixed bit and the information bit may be adjacent or interleaved. For example, $u_1$, $u_2$, $u_3$, and $u_5$ are fixed bits, and may all be 0, and $u_4$, $u_6$, $u_7$, and $u_8$ are information bits. A circled plus symbol $\oplus$ shown in the figure represents an exclusive OR operation. $u_1$, $u_2$, $u_3$, $u_4$, $u_8$, $u_6$, $u_7$, and $u_8$ form a bit sequence that is not encoded, $v_1$, $v_2$, $v_3$, $v_4$, $v_5$, $v_6$, $v_7$, $v_8$, $w_1$, $w_2$, $w_3$, $w_4$, $w_5$, $w_6$, $w_7$, and $w_8$ are intermediate results in an encoding process, and $x_1$, $x_2$, $x_3$, $x_4$, $x_5$, $x_6$, $x_7$, and $x_8$ form an encoded bit sequence. The intermediate result in the encoding process is merely an example. This is not limited in embodiments of this application.

3. Polar Code Decoding

There are a plurality of possible implementations of the polar code decoding, for example, successive cancellation (SC) decoding, successive cancellation list (SCL) decoding, and successive cancellation stack decoding.

The SC decoding is the earliest proposed polar code decoding, and may be described as a process of searching a code tree for a correct path. For example, one code whose code length is $N=2^n$ may correspond to one n-layer binary decoding code tree. In the SC decoding, decoding is performed bit by bit from a root node of the code tree to a bottom layer.

In a case of a limited code length, performance in which the polar code is decoded based on the SC decoding is not ideal. The SCL decoding and the successive cancellation stack decoding are improved algorithms of the SC decoding. In the SCL decoding, performance of a polar code of a limited code length can be improved by simultaneously reserving a plurality of decoding paths in a decoding process and finally outputting a decoding result with a highest probability. In addition, in the SCL decoding, cyclic redundancy check (CRC) may further be used to assist in selecting a correct decoding result, so that the performance of the polar code of the limited code length may be further improved.

4. Source Entropy Polarization

When a polar code is used for source encoding, the source entropy polarization may occur. The following uses an example in which two source bits are polarized to describe how a binary source entropy is polarized.

Figure 4:
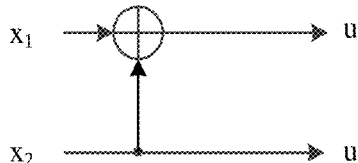
FIG. 4 is an example diagram of source entropy polarization.

FIG. 4 shows a process of the source entropy polarization. As shown in FIGS. 4, $X_1$ and $X_2$ may be two independent Bernoulli sources whose distribution probabilities are p (namely, Ber(p) sources), where a source entropy is $H(x_1)=H(x_2)=H(p)=-p \log_2 p-(1-p)\log_2(1-p)$. After the source entropy is subject to a polar code generation matrix $$F = \begin{bmatrix} 1 & 0 \\ 1 & 1 \end{bmatrix},$$

$u_1=x_1 \oplus x_2$ may be obtained, where $u_2=x_2$.

Because the polar code generation matrix F is an invertible matrix, a sum of entropies obtained through a polarization operation in FIG. 5 remains unchanged. Therefore, $H(x_1 x_2)=H (u_1 u_2)=H(u_1)+H(u_2|u_1)$. Because $u_2=x_2$, $H(u_2/u_1)\leq H(x_2)=H(x_1)$. Because the sum remains unchanged, $H(u_1)\geq H(x)$.

It can be learned from the foregoing derivation that, after the polarization operation is performed, the two independent and identically distributed Bernoulli sources become a source with a greater source entropy and a source with a smaller source entropy. This is a basic principle of the source polarization.

If the foregoing process is repeated, the two independent and identically distributed sources, namely, the entropies $H(u_1)$ and $H(u_2|u_1)$, are further polarized. In this case, a corresponding polarization matrix is $$G_N = \begin{bmatrix} 1 & 0 \\ 1 & 1 \end{bmatrix}^{\otimes n},$$

where $\otimes$ is a tensor product, and a polarization process is obtained by using $u_N=x_N G_N$. The following formula is obtained based on a chain formula of the entropy:

$$H(u_N) = \sum_{i=1}^{N} H\left(u_i \mid u_1^{i-1}\right).$$

According to a source polarization theory, $$H\left(u_i \mid u_1^{i-1}\right)$$

may be continuously polarized as N increases, but a range is $$0 \le H\left(u_i \mid u_1^{i-1}\right) \le 1.$$

Therefore, in an extreme case in which N tends to be infinite, $$H\left(u_i \mid u_1^{i-1}\right)$$

is polarized to 1 or polarized to 0. According to total entropy conservation, that is, $H(u_N)=H(x)=NH(x)$, it can be learned that a proportion of a part in which $$H\left(u_i \mid u_1^{i-1}\right)$$

is polarized to 1 is H(x), that is, $$\lim_{N\to\infty} \frac{\left|i \in [N] : H\left(u_i \mid u_1^{i-1}\right) = 1\right|}{N} = H(x)$$

and $$\lim_{N\to\infty} \frac{\left|i \in [N] : H\left(u_i \mid u_1^{i-1}\right) = 0\right|}{N} = 1 - H(x).$$

According to the principle of the source entropy polarization, it can be learned that source compression based on the polar code may theoretically reach a compression limit as the code length N tends to be infinite.

5. Lossless Source Compression

The lossless source compression means that, during source encoding, a bit occurrence probability in a source is changed, and correlation between bits is reduced, to increase an average information amount of bits, and a same amount of information is transmitted by using fewer code-elements.

For example, in the foregoing process of the binary source entropy polarization, compression of a signal $x_N$ may be converted into compression of $u_N$. A part of bits $$H(u_i \mid u_1^{i-1})$$

in $u_N$ are equal to 0, may be completely determined by another bit $u_{i-1}$, and do not need to be stored. Only the other part of bits $$H(u_i \mid u_1^{i-1}) = 1$$

need to be stored. For example, it is assumed that the source $x_N$ conforms to Bernoulli distribution Ber(p), and polarization and transformation is performed on the source, that is, $u_N = x_N G_N$, where $x_N = \{x_1, x_2, \ldots, x_N\}$ is a non-uniformly distributed binary source sequence of a length of N. According to the source polarization theory, as N increases, a part of conditional entropies $$H(u_i \mid u_1^{i-1})$$

(where i is a positive integer from 1 to N) tend to be 0 (where $u_i$ can be basically determined after $$u_1^{i-1}$$

is given), and the other part of conditional entropies tend to be 1 (where $u_i$ is still cannot be determined after $$u_1^{i-1}$$

is given). According to this principle, $u_N$ is divided into two parts. A part is referred to as redundant bits (bits whose conditional entropies are close to 0), and the other part is referred to as fixed bits (bits whose conditional entropies are close to 1). An index set of these redundant bits is denoted as I, and an index set of the fixed bits is denoted as F. $u_N = [u_F, u_I]$, where $u_F$ is a compressed reserved signal.

When the source is restored, a source decoding operation may be equivalent to a channel decoding operation on a binary symmetric channel (BSC) channel, and noise distribution of the source decoding operation may be the same as that of $x_N$, so that $u_N = 0$ is obtained. When $u_N$ and $u_F$ are known, $u_I$ may be correctly restored by using a polar code decoder.

It can be learned from the foregoing derivation process that, it is theoretically proved that when N tends to be infinite, a lossless compression limit can be reached by performing source compression by using the polar code. However, in an actual application scenario, the length of the source sequence is limited. In this case, the lossless compression cannot be implemented for the source compression implemented by encoding the source by using the polar code, and compression performance is poor.

To clearly describe the technical solutions in embodiments of this application, terms such as "first" and "second" are used in embodiments of this application to distinguish between same items or similar items that provide basically same functions or purposes. For example, a first transformation matrix and a second transformation matrix are used to distinguish between different transformation matrices, and a sequence of the first transformation matrix and the second transformation matrix is not limited. A person skilled in the art may understand that the terms such as "first" and "second" do not limit a quantity or an execution sequence, and the terms such as "first" and "second" do not indicate a definite difference.

It should be noted that, in this application, terms such as "example" or "for example" are used for representing giving an example, an illustration, or a description. Any embodiment or design scheme described as an "example" or "for example" in this application should not be explained as being more preferred or having more advantages than another embodiment or design scheme. Exactly, use of the term "example", "for example", or the like is intended to present a related concept in a specific manner.

In addition, "at least one" means one or more, and "a plurality of" means two or more than two. "And/or" describes an association relationship between associated objects, and represents that three relationships may exist. For example, A and/or B may represent the following cases: Only A exists, both A and B exist, and only B exists, where A and B may be singular or plural. The character "/" generally indicates an "or" relationship between the associated objects. At least one of the following items (pieces) or a similar expression thereof indicates any combination of these items, including a single item (piece) or any combination of a plurality of items (pieces). For example, at least one of a, b, and c may indicate a, or b, or c, or a and b, or a and c, or b and c, or a, b, and c, where a, b, and c may be singular or plural.

FIG. 5 is a schematic flowchart of an encoding method 500 based on a polar code according to an embodiment of this application. The method 500 may be performed by a sending device, for example, a terminal device or a network device. The method 500 may be applied to the communication system 100 in FIG. 1, or may be applied to another communication system. This is not limited in embodiments of this application.

As shown in FIG. 5, the method 500 may include the following steps.

S501: Obtain a source bit sequence.

For example, the source bit sequence may be a binary row vector whose length is N, where N is an integer greater than or equal to 1.

The source bit sequence may also be referred to as to-be-encoded information or a to-be-encoded bit sequence. This is not limited in embodiments of this application.

S502: Encode the source bit sequence by using a polar code generation matrix that is based on sub-block column transformation, to obtain a first bit sequence, where the polar code generation matrix that is based on the sub-block column transformation is determined based on a first polar code generation matrix and a transformation matrix, and the transformation matrix may achieve effect of performing sub-block column transformation on the first polar code generation matrix.

The polar code generation matrix that is based on the sub-block column transformation may mean that there is a submatrix on which column transformation is performed in a polar code generation matrix, and a polar code generation matrix obtained through the column transformation is a polar code generation matrix that is based on sub-block column transformation. For example, the polar code generation matrix is N×N-dimensional, column transformation is performed on a submatrix that is at an upper left corner of the polar code generation matrix and that is N/2×N/2-dimensional, and other parts remain unchanged, so that a polar code generation matrix can be obtained through the column transformation. The polar code generation matrix obtained through the column transformation is the polar code generation matrix that is based on the sub-block column transformation.

It should be noted that the polar code generation matrix that is based on the sub-block column transformation is merely an example of a name, and may also be referred to as a polar code generation matrix that is based on partial column transformation. This is not limited in embodiments of this application.

It should be further noted that the column transformation may be random column transformation. For example, the column transformation may be for exchanging a $3^{rd}$ column and a $1^{st}$ column of a submatrix in the polar code generation matrix. This is not limited in embodiments of this application.

The first polar code generation matrix is a polar code generation matrix in a conventional technology. A dimension of the first polar code generation matrix is not limited in embodiments of this application. For example, the first polar code generation matrix may be $G_N=F^{\otimes n}$, where $$F = \begin{bmatrix} 1 & 0 \\ 1 & 1 \end{bmatrix},$$

and N represents that the first polar code generation matrix is N×N-dimensional.

The sub-block column transformation may be understood as that column transformation is performed on a submatrix. To be specific, the transformation matrix may enable the column transformation to be performed on a submatrix in the first polar code generation matrix, to obtain the polar code generation matrix that is based on the sub-block column transformation. The sending device may perform encoding by using the polar code generation matrix that is based on the sub-block column transformation.

In comparison with an original encoding manner, in this encoding manner, an encoding sequence of intermediate results in an encoding process may be changed, the effect of performing sub-block column transformation on the polar code generation matrix is objectively achieved, and performance of a code spectrum is improved.

For example, in the diagram of encoding shown in FIG. 3, the intermediate results in the encoding process may include $v_1$, $v_2$, $v_3$, $v_4$, $v_5$, $v_6$, $v_7$, $v_8$, $w_1$, $w_2$, $w_3$, $w_4$, $w_5$, $w_6$, $w_7$, and $w_8$. The transformation matrix may change at least two of a plurality of intermediate results. For example, the transformation matrix may change a sequence of $w_1$, $w_2$, $w_3$, and $w_4$, so that a subsequent encoding result changes.

The sending device may determine, based on the first polar code generation matrix and the transformation matrix, the polar code generation matrix that is based on the sub-block column transformation. The sending device may determine the polar code generation matrix that is based on the sub-block column transformation in a plurality of implementations.

In a possible implementation, the polar code generation matrix that is based on the sub-block column transformation is a result of multiplying the first polar code generation matrix by the transformation matrix.

In another possible implementation, the polar code generation matrix that is based on the sub-block column transformation is a result of multiplying the transformation matrix by the first polar code generation matrix.

S503: Compress the first bit sequence, to obtain a compressed bit sequence.

The sending device may compress the first bit sequence in an existing implementation. For example, the source bit sequence includes a redundant bit and a fixed bit, and the first bit sequence includes a bit sequence corresponding to the redundant bit and a bit sequence corresponding to the fixed bit. The sending device compresses the first bit sequence, and the obtained compressed bit sequence is the bit sequence corresponding to the fixed bit. It should be understood that the bit sequence corresponding to the redundant bit includes a bit obtained by encoding the redundant bit by using the polar code generation matrix that is based on the sub-block column transformation, and the bit sequence corresponding to the fixed bit includes a bit obtained by encoding the fixed bit by using the polar code generation matrix that is based on the sub-block column transformation.

S504: Output the compressed bit sequence.

The sending device performs source encoding on the source bit sequence through S502 and S503, to obtain the compressed bit sequence, and outputs the compressed bit sequence, to perform channel encoding, rate matching, and modulation. After operations such as channel encoding, rate matching, and modulation are performed, the compressed bit sequence is sent to a receiving device through a channel.

In the encoding method based on a polar code provided in this embodiment, the transformation matrix can enable the column transformation to be performed on the submatrix in the first polar code generation matrix, to obtain the polar code generation matrix that is based on the sub-block column transformation. Encoding is performed by using the polar code generation matrix that is based on the sub-block column transformation, so that a quantity of codewords with a minimum code distance in an original polar code can be reduced, and a code spectrum can be improved. This helps obtain better compression performance. In addition, a length of the source bit sequence is not limited in this manner, and compression performance of a source sequence of a limited length can be improved.

In S502, there are a plurality of possible implementations of encoding the source bit sequence by using the polar code generation matrix that is based on the sub-block column transformation, to obtain the first bit sequence.

In a possible implementation, S502 includes: encoding the source bit sequence based on the first polar code generation matrix, to obtain a second bit sequence; and transforming the second bit sequence based on the transformation matrix, to obtain the first bit sequence.

For example, FIG. 6 is a schematic block diagram of encoding based on a polar code. The sending device first encodes the source bit sequence based on the first polar code generation matrix G, to obtain the second bit sequence, and then transforms the second bit sequence based on the transformation matrix P, to obtain the first bit sequence.

This implementation may be briefly described as "encoding before transformation". However, embodiments of this application is not limited thereto.

After obtaining the first bit sequence $u_N$, the sending device may compress the first bit sequence, to obtain the compressed bit sequence $u_F$, and send $u_F$ to the receiving device. Correspondingly, the receiving device may receive $u_F$, and decompress and decode the compressed bit sequence.

Specifically, the receiving device obtains a to-be-decoded bit sequence, namely, $u_F$; decompresses the to-be-decoded bit sequence Ur, to obtain a bit sequence that is not compressed; and decodes, by using an inverse matrix of the polar code generation matrix that is based on the sub-block column transformation, the bit sequence that is not compressed, to obtain the source bit sequence, where the polar code generation matrix that is based on the sub-block column transformation is determined based on the first polar code generation matrix and the transformation matrix.

For example, an implementation of decompression and decoding may include: The receiving device performs decoding through a virtual BSC (p) channel, where p is a channel parameter or a transition probability. It is assumed that an all-0 signal received through the channel is a vector y that is 1×N-dimensional. On the premise that a frozen bit $u_F$ of the received signal is known, in a process in which the receiving device performs decoding, when decoding is performed at a location at which an original encoding sequence changes, a reverse operation is performed on a currently input log-likelihood ratio (LLR), and then channel decoding continues to be performed, that is, $û=f(y=0, u_F)$, to obtain a decoding result. Then, the decoding result is multiplied by an inverse matrix of the transformation matrix P, and then multiplied by the first polar code generation matrix, so that an original source $\hat{x}$ can be restored.

Optionally, the transformation matrix P may be expressed as the following formula:

$$P = \begin{bmatrix} (G_{N/2})_{permute} \cdot G_{N/2} & 0 \\ 0 & I \end{bmatrix}^{-1},$$

where $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

It should be understood that dimensions of the second polar code generation matrix and the first polar code generation matrix are merely examples. This is not limited in embodiments of this application.

The first preset column transformation may be random column transformation. For example, the first preset column transformation may be for exchanging a $3^{rd}$ column and a $1^{st}$ column in the second polar code generation matrix. This is not limited in embodiments of this application.

The transformation matrix obtained through the first preset column transformation may achieve the effect of performing sub-block column transformation on the first polar code generation matrix. The foregoing method is performed by using the transformation matrix, to help reduce the quantity of codewords with the minimum code distance, and improve the performance of the code spectrum.

It should be noted that source encoding and channel encoding are dual, and the method provided in embodiments of this application may alternatively be applied to a scenario of the channel encoding. In the scenario of the channel encoding, an encoding process may be expressed as:

$$x = u \cdot P^{-1} \cdot G = u \cdot \begin{bmatrix} (G_{N/2})_{permute} \cdot G_{N/2} & 0 \\ 0 & I \end{bmatrix} \cdot G.$$

To be specific, in a channel, the sending device first transforms an information bit u based on the inverse matrix of the transformation matrix P, and then performs encoding based on the first polar code generation matrix, so that the code spectrum can be improved.

Optionally, the transformation matrix P may be obtained by using a matrix S, where P=G·S·G, G is the first polar code generation matrix, and the matrix S is expressed as the following formula:

$$S = \begin{bmatrix} G_{N/2} \cdot (G_{N/2})_{permute} & 0 \\ I - G_{N/2} \cdot (G_{N/2})_{permute} & I \end{bmatrix}^{-1},$$

where $G_{N/2}$ is the second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through the first preset column transformation of $G_{N/2}$, 0 is the zero matrix of N/2×N/2, and I is the unit matrix of N/2×N/2.

G is the first polar code generation matrix, and $G=G^{-1}$. Therefore, P=G·S·G may also be described as $P=G·S·G^{-1}$. This is not limited in embodiments of this application.

In another possible implementation, the encoding the source bit sequence by using a polar code generation matrix that is based on sub-block column transformation, to obtain a first bit sequence in S502 includes: transforming the source bit sequence based on the transformation matrix, to obtain a fourth bit sequence; and encoding the fourth bit sequence based on the first polar code generation matrix, to obtain the first bit sequence.

For example, FIG. 7 is a schematic block diagram of encoding based on a polar code. The sending device first transforms the source bit sequence based on the transformation matrix S, to obtain the fourth bit sequence, and then encodes the fourth bit sequence based on the first polar code generation matrix G, to obtain the first bit sequence.

This implementation may be briefly described as "transformation before encoding". However, embodiments of this application are not limited thereto.

After obtaining the first bit sequence $u_N$, the sending device may compress the first bit sequence, to obtain the compressed bit sequence $u_F$, and send $u_F$ to the receiving device. Correspondingly, the receiving device may receive $u_F$, and decompress and decode the compressed bit sequence.

For example, the receiving device performs decoding through a virtual BSC (p) channel, where p is a channel parameter or a transition probability. It is assumed that an all-0 signal received through the channel is a vector y that is 1×N-dimensional. On the premise that a frozen bit $u_F$ of the received signal is known, in a process in which the receiving device performs decoding, when decoding is performed at a location at which an original encoding sequence changes, a reverse operation is performed on a currently input LLR, and then channel decoding continues to be performed, that is, $\hat{u}=f(y=0, u_F)$, to obtain a decoding result. Then, the decoding result is multiplied by the first polar code generation matrix, and then multiplied by the inverse matrix of the transformation matrix P, so that an original source $\hat{x}$ can be restored.

Optionally, the transformation matrix S may be expressed as the following formula:

$$S = \begin{bmatrix} G_{N/2} \cdot (G_{N/2})_{permute} & 0 \\ I - G_{N/2} \cdot (G_{N/2})_{permute} & I \end{bmatrix}^{-1},$$

where $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

In this case, if $G_{N/2} \cdot (G_{N/2})_{permute} = S_{permute}$, the transformation matrix S may be simplified as $$S = \begin{bmatrix} S_{permute} & 0 \\ I - S_{permute} & I \end{bmatrix}^{-1}.$$

A value in the first preset column transformation may be a location of 1 in each column in $S_{permute}$, and remaining locations in the matrix $S_{permute}$ are 0.

For example, when the first preset column transformation is [1, 2, 3, 4], $$S_{permute} = \begin{bmatrix} 0 & 0 & 0 & 1 \\ 0 & 0 & 1 & 0 \\ 0 & 1 & 0 & 0 \\ 1 & 0 & 0 & 0 \end{bmatrix}.$$

It should be noted that source encoding and channel encoding are dual, and the method provided in embodiments of this application may alternatively be applied to a scenario of the channel encoding. In the scenario of the channel encoding, an encoding process may be expressed as:

$$x = u \cdot G \cdot S^{-1} = u \cdot G \cdot \begin{bmatrix} G_{N/2} \cdot (G_{N/2})_{permute} & 0 \\ I - G_{N/2} \cdot (G_{N/2})_{permute} & I \end{bmatrix}^{-1}.$$

To be specific, in a channel, the sending device first encodes an information bit u based on the first polar code generation matrix, and then performs transformation based on an inverse matrix of the transformation matrix S, so that the code spectrum can be improved.

Optionally, the transformation matrix S may be obtained by using the matrix P, where S=G·P·G, G is the first polar code generation matrix, and the matrix P is expressed as the following formula:

$$P = \begin{bmatrix} (G_{N/2})_{permute} \cdot G_{N/2} & 0 \\ 0 & I \end{bmatrix}^{-1},$$

where $G_{N/2}$, is the second polar code generation matrix, N/2 represents that the second polar code generation matrix is N/2×N/2-dimensional, N represents that the first polar code generation matrix is N×N-dimensional, $(G_{N/2})$ permute is the matrix obtained through the first preset column transformation of $G_{N/2}$, 0 is the zero matrix of N/2×N/2, and I is the unit matrix of N/2×N/2.

G is the first polar code generation matrix, and G=G⁻¹. Therefore, S=G·P·G may also be described as S=G·P·G⁻¹. This is not limited in embodiments of this application.

The first bit sequence may be obtained in both the foregoing two possible implementations, and the first bit sequences are the same. Therefore, although the implementations are different, same effects are achieved. In both the implementations, the quantity of codewords with the minimum code distance in the original polar code can be reduced, and the code spectrum is improved. This helps obtain the better compression performance. In addition, the length of the source bit sequence is not limited in the manners, and the compression performance of the source sequence of the limited length can be improved.

In the foregoing two possible implementations, the transformation matrix includes one matrix: P or S. The following describes a case in which the transformation matrix includes two matrices.

When the transformation matrix includes two matrices, there are a plurality of possible implementations. In a possible implementation, the transformation matrix includes a first transformation matrix and a second transformation matrix. In the foregoing method of "encoding before transformation", the transforming the second bit sequence based on the transformation matrix, to obtain the first bit sequence may include: transforming the second bit sequence based on the first transformation matrix, to obtain a third bit sequence; and transforming the third bit sequence based on the second transformation matrix, to obtain the first bit sequence, where the first transformation matrix and the second transformation matrix may achieve the effect of performing sub-block column transformation on the first polar code generation matrix.

For example, FIG. 8 is a schematic block diagram of encoding based on a polar code. As shown in FIG. 8, the sending device first encodes the source bit sequence based on the first polar code generation matrix G, to obtain the second bit sequence, then transforms the third bit sequence based on the first transformation matrix $P_1$, to obtain the third bit sequence, and finally transforms the third bit sequence based on the second transformation matrix $P_2$, to obtain the first bit sequence.

After obtaining the first bit sequence $u_N$, the sending device may compress the first bit sequence, to obtain the compressed bit sequence $u_F$, and send $u_F$ to the receiving device. Correspondingly, the receiving device may receive $u_F$, and decompress and decode the compressed bit sequence.

For example, the receiving device performs decoding through a virtual binary symmetric channel, for example, a BSC (p) channel, where p is a channel parameter or a transition probability. It is assumed that an all-0 signal received through the channel is a vector y that is 1×N-dimensional. On the premise that a frozen bit $u_F$ of the received signal is known, in a process in which the receiving device performs decoding, when decoding is performed at a location at which an original encoding sequence changes, a reverse operation is performed on a currently input LLR, and then channel decoding continues to be performed, that is, $\hat{u}=f(y=0, u_F)$, to obtain a decoding result. Then, the decoding result is multiplied by an inverse matrix of the second transformation matrix $P_2$, multiplied by an inverse matrix of the first transformation matrix $P_1$, and then multiplied by the first polar code generation matrix, so that an original source $\hat{x}$ can be restored.

Optionally, the first transformation matrix $P_1$ may be expressed as the following formula:

$$P_1 = \begin{bmatrix} A & 0 \\ 0 & B \end{bmatrix}^{-1},$$

where $$A = \begin{bmatrix} (G_{N/4})_{permute1} \cdot G_{N/4} & 0 \\ 0 & I \end{bmatrix},$$

$$B = \begin{bmatrix} (G_{N/4})_{permute2} \cdot G_{N/4} & 0 \\ 0 & I \end{bmatrix},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is a matrix obtained through second preset column transformation of $G_{N/4}$, $(G_{N/4})_{permute2}$ is a matrix obtained through third preset column transformation of $G_{N/4}$, 0 is a zero matrix, and I is a unit matrix of N/4×N/4.

The second preset column transformation may be random column transformation, and the third preset column transformation may also be random column transformation. The second preset column transformation and the third preset column transformation may be the same, or may be different. This is not limited in embodiments of this application.

If the second preset column transformation is the same as the third preset column transformation, from a perspective of a method, the first transformation matrix may be obtained through same preset column transformation, where the method is simple and has high universality. From a perspective of hardware, the second preset column transformation and the third preset column transformation may reuse a same set of devices, where a structure is simple and costs are reduced.

If the second preset column transformation is different from the third preset column transformation, the first transformation matrix may be obtained through different preset column transformation, and is applicable to different cases. This is flexible and has a wide application scope.

It should be noted that zero matrices in the matrix A and the matrix B are N/4×N/4-dimensional, and a zero matrix in the first transformation matrix $P_1$ is N/2×N/2-dimensional.

Optionally, the second transformation matrix $P_2$ may be expressed as the following formula:

$$P_2 = \begin{bmatrix} C & 0 \\ 0 & I \end{bmatrix}^{-1},$$

where $$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},$$

$$\begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, 0 is the zero matrix, and I is a unit matrix of N/2×N/2.

The fourth preset column transformation may be random column transformation, and is different from the second preset column transformation and the third preset column transformation. The first transformation matrix and the second transformation matrix may be obtained through the second preset column transformation, the third preset column transformation, and the fourth preset column transformation. The first transformation matrix and the second transformation matrix may achieve an effect of performing column transformation on more submatrices in the first polar code generation matrix. The foregoing method is performed by using the first transformation matrix and the second transformation matrix, to help reduce the quantity of codewords with the minimum code distance, and improve the performance of the code spectrum.

It should be noted that a zero matrix in the matrix C is N/4×N/4-dimensional, and a zero matrix in the second transformation matrix $P_2$ is N/2×N/2-dimensional.

It should be further noted that source encoding and channel encoding are dual, and the method provided in embodiments of this application may alternatively be applied to a scenario of the channel encoding. In the scenario of the channel encoding, an encoding process may be expressed as:

$$x = u \cdot P_2^{-1} \cdot P_1^{-1} \cdot G = u \cdot \begin{bmatrix} C & 0 \\ 0 & I \end{bmatrix} \cdot \begin{bmatrix} A & 0 \\ 0 & B \end{bmatrix} \cdot G.$$

To be specific, in a channel, the sending device first transforms an information bit u based on an inverse matrix of the second transformation matrix $P_2$, then performs transformation based on the first transformation matrix $P_1$, and finally performs encoding based on the first polar code generation matrix, so that the code spectrum can be improved.

Optionally, the first transformation matrix $P_1$ and the second transformation matrix $P_2$ may be obtained by using a matrix $S_1$ and a matrix $S_2$, $P_1 \cdot P_2 = G \cdot S \cdot S_2 \cdot G$, G is the first polar code generation matrix, and the matrix $S_1$ is expressed as the following formula:

$$S_1 = \begin{bmatrix} D & 0 \\ I - D & I \end{bmatrix}^{-1},$$

where $$D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{premute1}$ is a matrix obtained through second preset column transformation of $G_{N/4}$, $$\left[\begin{array}{cc}(G_{N/4})_{permute1} & 0 \\ G_{N/4} & G_{N/4}\end{array}\right]_{permute3}$$

is a matrix obtained through fourth preset column transformation of $$\left[\begin{array}{cc}(G_{N/4})_{permute1} & 0 \\ G_{N/4} & G_{N/4}\end{array}\right],$$

0 is a zero matrix, and I is a unit matrix of N/2×N/2.

The matrix $S_2$ is expressed as the following formula:

$$S_2 = \left[\begin{array}{cc}J & 0 \\ K & M\end{array}\right]^{-1},$$

where $$J = \left[\begin{array}{cc}G_{N/4} \cdot (G_{N/4})_{permute1} & 0 \\ I - G_{N/4} \cdot (G_{N/4})_{permute1} & I\end{array}\right],$$

$$K = \left[\begin{array}{cc}G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0\end{array}\right],$$

$$M = \left[\begin{array}{cc}G_{N/4} \cdot (G_{N/4})_{permute2} & 0 \\ I - G_{N/4} \cdot (G_{N/4})_{permute2} & I\end{array}\right],$$

and $(G_{N/4})_{permute2}$ is a matrix obtained through third preset column transformation of $G_{N/4}$.

It should be noted that a zero matrix in the matrix D is N/4×N/4-dimensional, a zero matrix in the matrix $S_1$ is N/2×N/2-dimensional, zero matrices in the matrices J, K, and M are N/4×N/4-dimensional, and a zero matrix in the matrix $S_2$ is N/2×N/2-dimensional.

In a possible implementation, the transformation matrix includes a third transformation matrix and a fourth transformation matrix. In the foregoing method of "transformation before encoding", the transforming the source bit sequence based on the transformation matrix, to obtain a fourth bit sequence may include: transforming the source bit sequence based on the third transformation matrix, to obtain a fifth bit sequence; and transforming the fifth bit sequence based on the fourth transformation matrix, to obtain the fourth bit sequence, where the third transformation matrix and the fourth transformation matrix may achieve the effect of performing sub-block column transformation on the first polar code generation matrix.

For example, FIG. 9 is a schematic block diagram of encoding based on a polar code. As shown in FIG. 9, the sending device first transforms the source bit sequence based on the third transformation matrix $S_1$, to obtain the fifth bit sequence, then transforms the fifth bit sequence based on the fourth transformation matrix $S_2$, to obtain the fourth bit sequence, and finally encodes the fourth bit sequence based on the first polar code generation matrix G, to obtain the first bit sequence.

After obtaining the first bit sequence $u_N$, the sending device may compress the first bit sequence, to obtain the compressed bit sequence $u_F$, and send $u_F$ to the receiving device. Correspondingly, the receiving device may receive $u_F$, and decompress and decode the compressed bit sequence.

For example, the receiving device performs decoding through a virtual BSC (p) channel, where p is a channel parameter or a transition probability. It is assumed that an all-0 signal received through the channel is a vector y that is 1×N-dimensional. On the premise that a frozen bit $u_F$ of the received signal is known, in a process in which the receiving device performs decoding, when decoding is performed at a location at which an original encoding sequence changes, a reverse operation is performed on a currently input LLR, and then channel decoding continues to be performed, that is, $\hat{u}=f(y=0, u_F)$, to obtain a decoding result. Then, the decoding result is multiplied by the first polar code generation matrix G, multiplied by an inverse matrix of the fourth transformation matrix $S_2$, and then multiplied by an inverse matrix of the third transformation matrix $S_1$, so that an original source $\hat{x}$ can be restored.

Optionally, the third transformation matrix $S_1$ may be expressed as the following formula:

$$S_1 = \left[\begin{array}{cc}D & 0 \\ I - D & I\end{array}\right]^{-1},$$

where $$D = \left[\begin{array}{cc}(G_{N/4})_{permute1} & 0 \\ G_{N/4} & G_{N/4}\end{array}\right]^{-1} \cdot \left[\begin{array}{cc}(G_{N/4})_{permute1} & 0 \\ G_{N/4} & G_{N/4}\end{array}\right]_{permute3},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{premute1}$ is a matrix obtained through second preset column transformation of $G_{N/4}$, $$\left[\begin{array}{cc}(G_{N/4})_{permute1} & 0 \\ G_{N/4} & G_{N/4}\end{array}\right]_{permute3}$$

is a matrix obtained through fourth preset column transformation of $$\left[\begin{array}{cc}(G_{N/4})_{permute1} & 0 \\ G_{N/4} & G_{N/4}\end{array}\right],$$

0 is a zero matrix, and I is a unit matrix of N/2×N/2.

It should be noted that a zero matrix in the matrix D is N/4×N/4-dimensional, and a zero matrix in the matrix $S_1$ is N/2×N/2-dimensional.

Optionally, the fourth transformation matrix $S_2$ is expressed as the following formula:

$$S_2 = \left[\begin{array}{cc}J & 0 \\ K & M\end{array}\right]^{-1},$$

where $$J = \left[\begin{array}{cc}G_{N/4} \cdot (G_{N/4})_{permute1} & 0 \\ I - G_{N/4} \cdot (G_{N/4})_{permute1} & I\end{array}\right],$$

$$K = \left[\begin{array}{cc}G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0\end{array}\right],$$

$$M = \left[\begin{array}{cc}G_{N/4} \cdot (G_{N/4})_{permute2} & 0 \\ I - G_{N/4} \cdot (G_{N/4})_{permute2} & I\end{array}\right],$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, $(G_{N/4})_{permute2}$ is a matrix obtained through third preset column transformation of $G_{N/4}$, 0 is the zero matrix, and I is a unit matrix of N/4×N/4.

The second preset column transformation and the third preset column transformation may be the same, or may be different. This is not limited in embodiments of this application.

It should be noted that zero matrices in the matrices J, K, and M are N/4×N/4-dimensional, and a zero matrix in the matrix $S_2$ is N/2×N/2-dimensional.

It should be further noted that source encoding and channel encoding are dual, and the method provided in embodiments of this application may alternatively be applied to a scenario of the channel encoding. In the scenario of the channel encoding, an encoding process may be expressed as:

$$x = u \cdot G \cdot S_2^{-1} \cdot S_1^{-1} = u \cdot G \begin{bmatrix} J & 0 \\ K & M \end{bmatrix} \cdot \begin{bmatrix} D & 0 \\ I-D & I \end{bmatrix}.$$

To be specific, in a channel, the sending device first encodes an information bit u based on the first polar code generation matrix, then transforms the information bit u based on the inverse matrix of the fourth transformation matrix $S_2$, and finally performs transformation based on the third transformation matrix $S_1$, so that the code spectrum can be improved.

Optionally, the third transformation matrix $S_1$ and the fourth transformation matrix $S_2$ are obtained by using a matrix $P_1$ and a matrix $P_2$, $S_1$, $S_2=G\cdot P\cdot P_2\cdot G$, G is the first polar code generation matrix, and the matrix $P_1$ is expressed as the following formula:

$$P_1 = \begin{bmatrix} A & 0 \\ 0 & B \end{bmatrix}^{-1},$$

where $$A = \begin{bmatrix} (G_{N/4})_{permute1} \cdot G_{N/4} & 0 \\ 0 & I \end{bmatrix},$$

$$B = \begin{bmatrix} (G_{N/4})_{permute2} \cdot G_{N/4} & 0 \\ 0 & I \end{bmatrix},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is a matrix obtained through second preset column transformation of $G_{N/4}$, $(G_{N/4})_{permute2}$ is a matrix obtained through third preset column transformation of $G_{N/4}$, 0 is a zero matrix, and I is a unit matrix of N/4×N/4.

The matrix $P_2$ is expressed as the following formula:

$$P_2 = \begin{bmatrix} C & 0 \\ 0 & I \end{bmatrix}^{-1},$$

where $$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},$$

and

-continued
$$\begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix}.$$

It should be noted that zero matrices in the matrix A and the matrix B are N/4×N/4-dimensional, a zero matrix in the matrix $P_1$ is N/2×N/2-dimensional, a zero matrix in the matrix C is N/4×N/4-dimensional, and a zero matrix in the matrix $P_2$ is N/2×N/2-dimensional.

It should be further noted that unit matrices in the matrix A and the matrix B are N/4×N/4-dimensional, and a unit matrix in the matrix $P_2$ is N/2×N/2-dimensional.

When the transformation matrix includes two transformation matrices: the first transformation matrix $P_1$ and the second transformation matrix $P_2$, or the third transformation matrix $S_1$ and the fourth transformation matrix $S_2$. In comparison with one transformation matrix, the two transformation matrices can achieve the effect of performing column transformation on more submatrices in the first polar code generation matrix. The foregoing method is performed by using the two matrices, so that an encoding sequence of more intermediate results in an encoding process can be changed.

For example, in the diagram of encoding shown in FIG. 3, the intermediate results in the encoding process may include $v_1$, $v_2$, $v_3$, $v_4$, $v_5$, $v_6$, $v_7$, $v_8$, $w_1$, $w_2$, $w_3$, $w_4$, $w_5$, $w_6$, $w_7$, and $w_8$. In comparison with one matrix, the two transformation matrices may change more intermediate results. For example, one transformation matrix may change a sequence of $w_1$, $w_2$, $w_3$, and $w_4$, and the two transformation matrices may change a sequence of $v_1$ and $v_2$, a sequence of $v_5$ and $v_6$, and a sequence of $w_1$, $w_2$, $w_3$, and $w_4$.

The two transformation matrices can reduce more codewords with the minimum code distance in the original polar code. This helps improve the code spectrum, so that the better compression performance is obtained. In addition, the length of the source bit sequence is not limited in this manner, and the compression performance of the source sequence of the limited length can be improved.

The foregoing describes in detail the encoding method based on a polar code, and the following describes in detail a method for determining preset column transformation in the method.

This embodiment provides two methods for determining the preset column transformation: an explicit method and an implicit method.

An implementation of an explicit manner is as follows: A sending device sends first indication information to a terminal device, where the first indication information indicates specific information of preset column transformation. A receiving device receives the first indication information from the sending device, and obtains the specific information of the preset column transformation based on the first indication information.

For example, the specific information of the preset column transformation may be [2, 3, 1, 4], indicating that an original four-column matrix is transformed in a sequence of a $2^{nd}$ column, a $3^{rd}$ column, a $1^{st}$ column, and a $4^{th}$ column.

For example, in a communication scenario between a base station and user equipment (UE), the base station may be a sending device, or may be a receiving device. When the base station is the sending device, and the UE is the receiving device, FIG. 10 is a schematic flowchart of determining the preset column transformation by the UE. The base station may send the first indication information (for example, pattern indication signaling) to the UE, where the first indication information indicates specific information of the preset column transformation used in the method 500, and obtain a compressed bit sequence based on the method 500. Correspondingly, the UE receives the compressed bit sequence and the first indication information, and obtains the specific information of the preset column transformation based on the first indication information.

Figure 11:
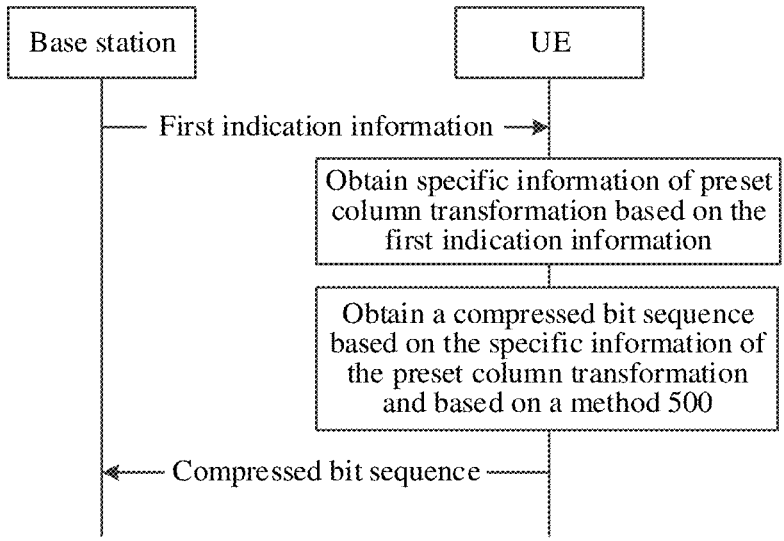
FIG. 11 is another example schematic flowchart of determining preset column transformation according to an embodiment of this application.

When the base station is the receiving device, and the UE is the sending device, FIG. 11 is a schematic flowchart of determining the preset column transformation by the UE. The base station may send the first indication information (for example, pattern indication signaling) to the UE, where the first indication information indicates the specific information of the preset column transformation. Correspondingly, the UE obtains the specific information of the preset column transformation based on the first indication information, encodes a source bit sequence based on the specific information of the preset column transformation by using the foregoing method 500, to obtain a compressed bit sequence, and sends the compressed bit sequence to the base station.

It should be noted that the first indication information may indicate specific information of one type of preset column transformation, or may indicate specific information of a plurality of types of preset column transformation. This is not limited in embodiments of this application.

For example, in the foregoing method 500, when the transformation matrix includes one transformation matrix, the first indication information may indicate the first preset column transformation. In the foregoing method 500, when the transformation matrix is two transformation matrices, the first indication information may indicate the second preset column transformation, the third preset column transformation, and the fourth preset column transformation.

An implementation of an implicit manner is as follows: A receiving device determines specific information of the preset column transformation in the foregoing method 500 by using second indication information, where the second indication information indicates index information of the preset column transformation that is used in the method 500 and that is in a plurality of types of preset column transformation.

Optionally, specific information of the plurality of types of preset column transformation may be indicated by using the first indication information.

Figure 12:
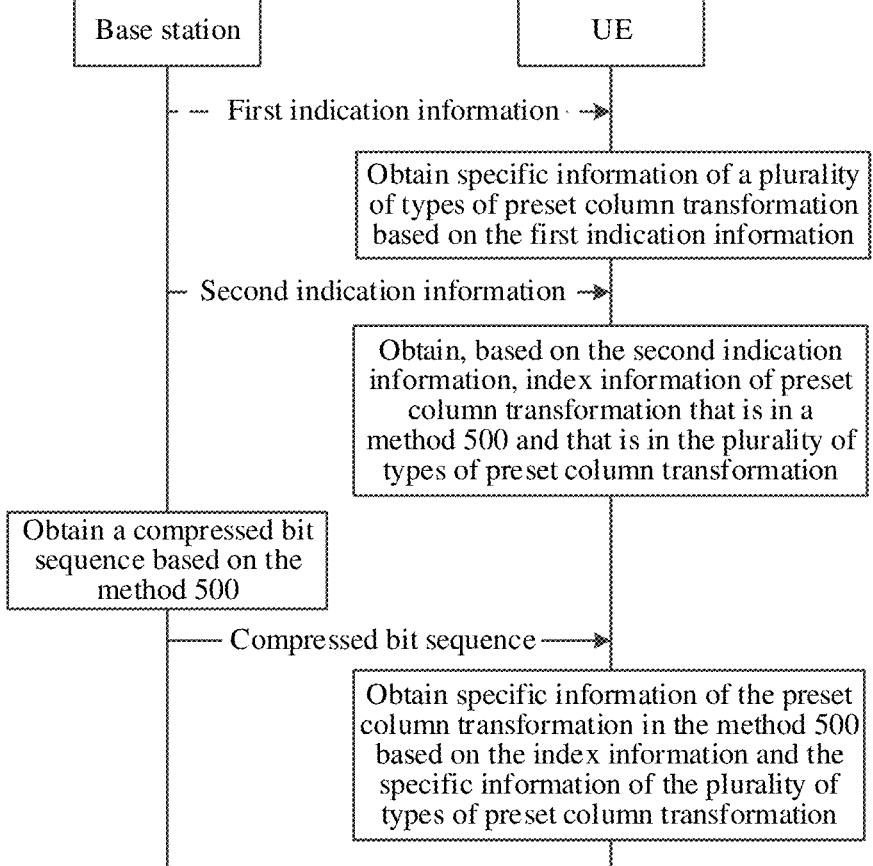
FIG. 12 is still another example schematic flowchart of determining preset column transformation according to an embodiment of this application.

For example, in a communication scenario between a base station and UE, when the base station is a sending device, and the UE is a receiving device, FIG. 12 is a schematic flowchart of determining the preset column transformation by the UE. The base station may send the first indication information (for example, pattern set indication signaling) to the UE, where the first indication information includes the specific information of the plurality of types of preset column transformation. Correspondingly, the UE receives the first indication information, and obtains the specific information of the plurality of types of preset column transformation based on the first indication information. The base station may further send the second indication information to the UE, where the second indication information indicates the index information (for example, pattern index indication signaling) of the preset column transformation that is used in the method 500 and that is in the plurality of types of preset column transformation. Correspondingly, the UE receives the second indication information, and obtains the index information of the preset column transformation that is in the method 500 and that is in the plurality of types of preset column transformation based on the second indication information. The base station obtains a compressed bit sequence by using the foregoing method 500, and sends the compressed bit sequence to the UE. Correspondingly, the UE receives the compressed bit sequence, and obtains the specific information of the preset column transformation in the method 500 based on the index information and the specific information of the plurality of types of preset column transformation.

It should be noted that the first indication information is optional, and therefore is represented by a dashed line in FIG. 12. There are two cases. One is the foregoing implicit manner, to be specific, the index information of the preset column transformation that is in the method 500 and that is in the plurality of types of preset column transformations needs to be indicated only by using the second indication information, and signaling overheads are low. In another implementation, neither the first indication information nor the second indication information is needed, but various preset column transformation matrices mentioned in the foregoing method are directly specified in a protocol. This method reduces signaling overheads and implementation complexity.

Figure 13:
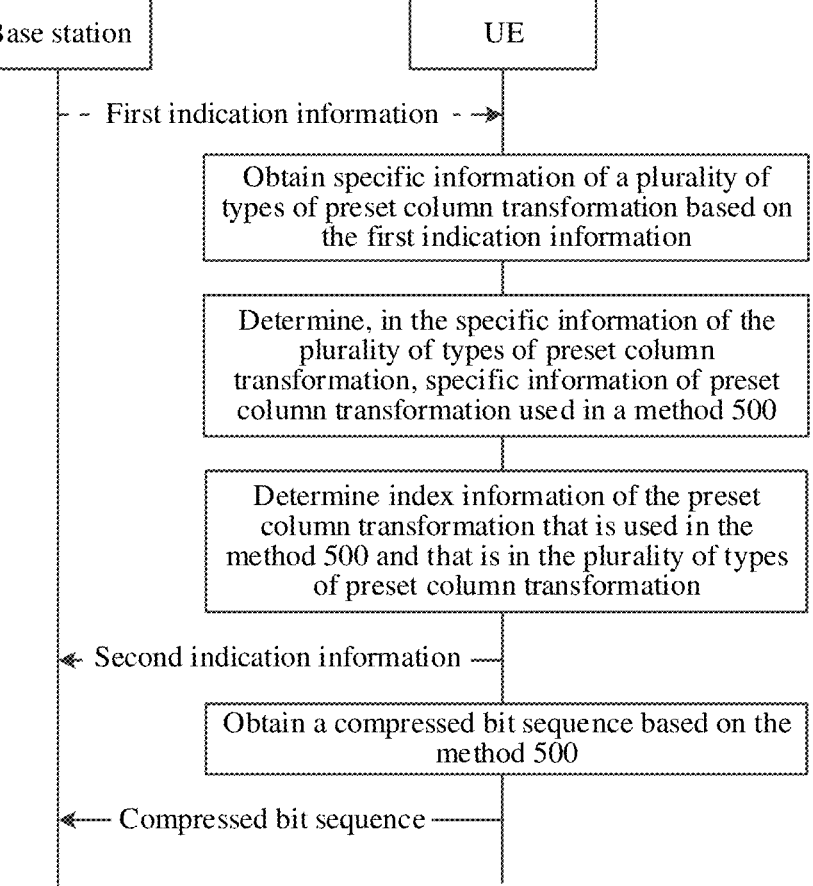
FIG. 13 is another example schematic flowchart of determining preset column transformation according to an embodiment of this application.

When the base station is the receiving device, and the UE is the sending device, FIG. 13 is a schematic flowchart of determining the preset column transformation by the UE. The base station may send the first indication information (for example, pattern set indication signaling) to the UE, where the first indication information includes the specific information of the plurality of types of preset column transformation. Correspondingly, the UE receives the first indication information, and obtains the specific information of the plurality of types of preset column transformation based on the first indication information. The UE determines, in the specific information of the plurality of types of preset column transformation, the specific information of the preset column transformation used in the method 500, and determines the index information of the preset column transformation in the plurality of types of preset column transformation, to send the second indication information (for example, pattern index indication signaling) to the base station, where the second indication information indicates the index information of the preset column transformation that is in the method 500 and that is in the plurality of types of preset column transformation. Correspondingly, the base station receives the second indication information, and obtains the index information. The UE obtains, based on the determined specific information of the preset column transformation, a compressed bit sequence by using the foregoing method 500, and sends the compressed bit sequence to the base station.

It should be noted that the first indication information is optional, and therefore is represented by a dashed line in FIG. 13.

In embodiments of this application, to verify beneficial effects of embodiments of this application, simulation is performed on the encoding method based on a polar code provided in embodiments of this application.

The transformation matrix in the method provided in embodiments of this application may be one matrix, or may be two matrices. Simulation is separately performed on the matrix and the two matrices in embodiments of this application.

When the transformation matrix may be one matrix, in embodiments of this application, simulation is performed on a CRC-aided polarization-adjusted convolution (CA-PAC), a CRC-aided successive cancellation list (CA-SCL), and the method provided in embodiments of this application, to compare performance thereof.

Figure 14:
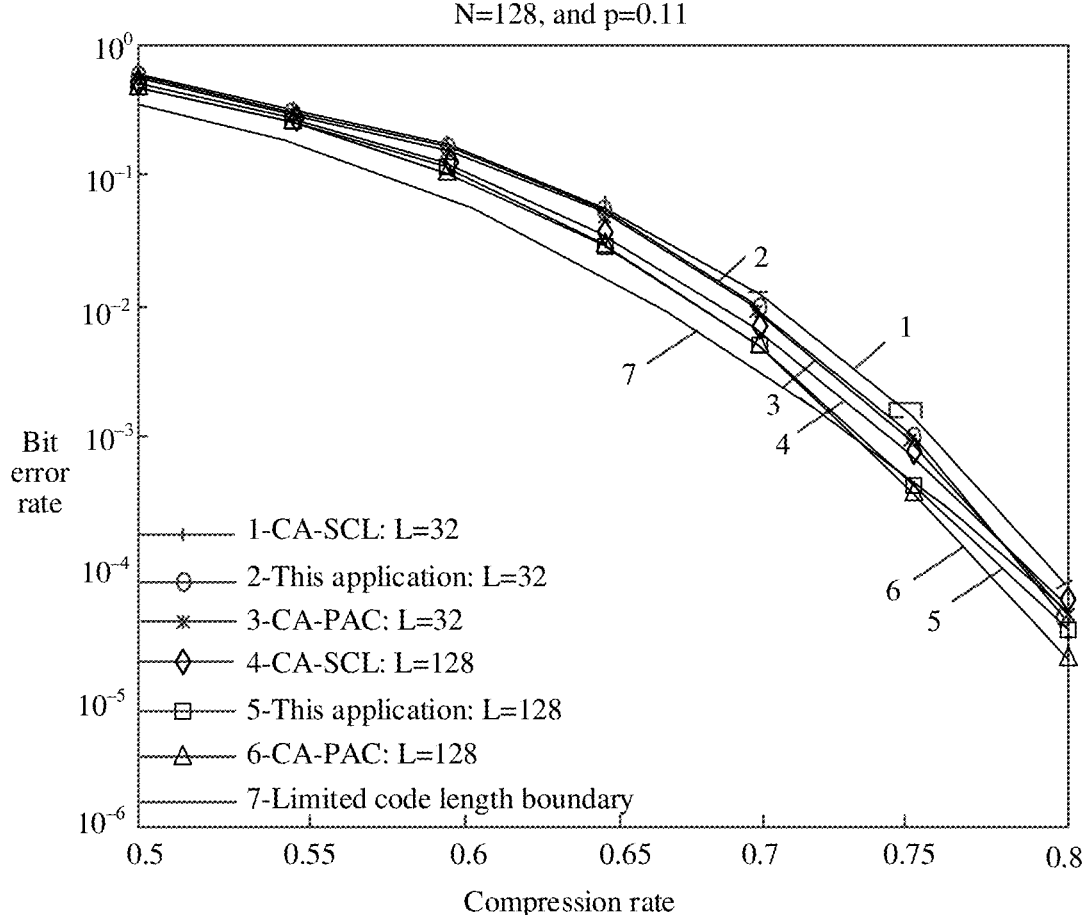
FIG. 14 is an example diagram of simulation according to an embodiment of this application.

For example, FIG. 14 is a diagram of simulation. As shown in FIG. 14, a length of a source bit sequence is 128, and the source bit sequence conforms to Ber(p) distribution, where p=0.11, and a quantity of CRC bits of the source bit sequence is 8. A line 1 represents a curve of bit error rates of a CA-SCL algorithm at different compression rates when a quantity L of paths is equal to 32. A line 2 represents a curve of bit error rates of the method in embodiments of this application at different compression rates when the quantity L of paths is equal to 32. A line 3 represents a curve of bit error rates of the CA-PAC at different compression rates when the quantity L of paths is equal to 32. A line 4 represents a curve of bit error rates of the CA-SCL algorithm at different compression rates when the quantity L of paths is equal to 128. A line 5 represents a curve of bit error rates of the method in embodiments of this application at different compression rates when the quantity L of paths is equal to 128. A line 6 represents a curve of bit error rates at different compression rates of the CA-PAC when the quantity L of paths is equal to 128. A line 7 represents a limited code length boundary. The transformation matrix in the method in embodiments of this application includes one transformation matrix.

It can be learned from FIG. 14 that, when L=32, performance of the method in embodiments of this application is similar to that of a CA-PAC solution, and is slightly better than performance of the CA-SCL algorithm. When L=128, the limited code length boundary is exceeded in the method in embodiments of this application and the CA-PAC solution when the compression rate is greater than 0.75. In other words, a theoretical boundary of a limited code length is basically reached in both the method in embodiments of this application and the CA-PAC

Solution

It should be noted that, in embodiments of this application, the limited code length boundary can be exceeded because the limited code length boundary is obtained through approximation by using a formula.

Figure 15:
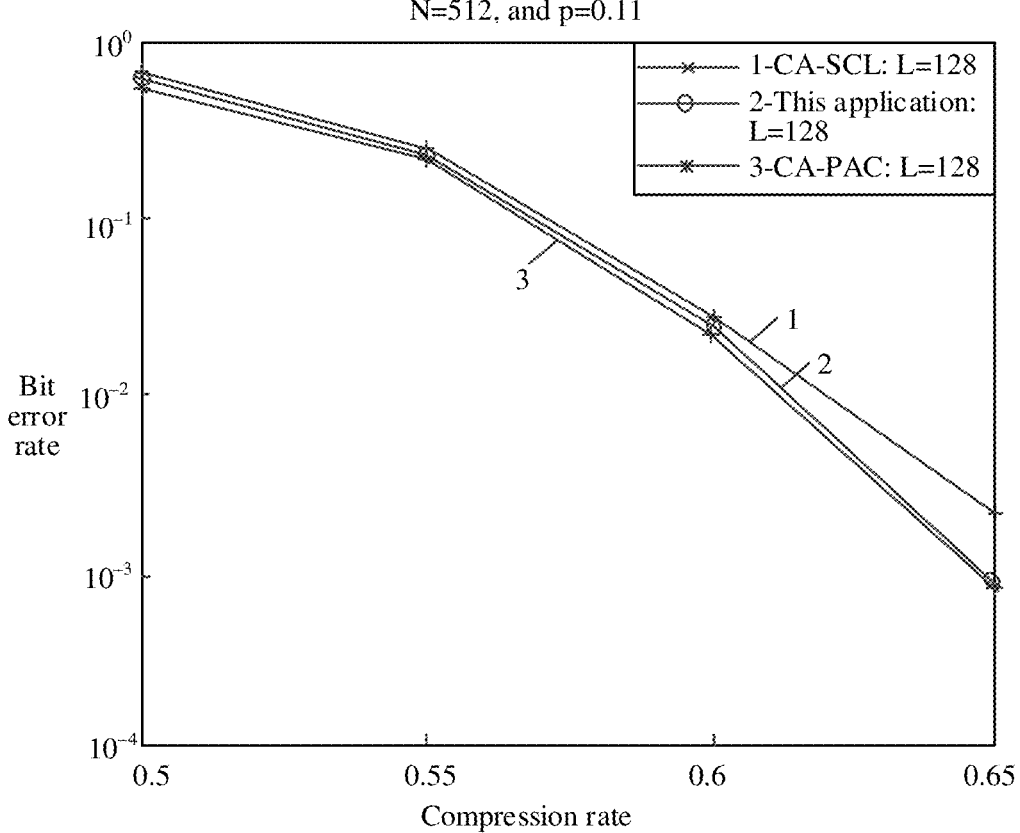
FIG. 15 is another example diagram of simulation according to an embodiment of this application.

For example, FIG. 15 is another diagram of simulation. As shown in FIG. 15, a length of a source bit sequence is 512, and the source bit sequence conforms to Ber(p) distribution, where p=0.11, and a quantity of CRC bits of the source bit sequence is 8. A line 1 represents a curve of bit error rates of a CA-SCL algorithm at different compression rates when a quantity L of paths is equal to 128. A line 2 represents a curve of bit error rates of the method in embodiments of this application at different compression rates when the quantity L of paths is equal to 128. A line 3 represents a curve of bit error rates of the CA-PAC at different compression rates when the quantity L of paths is equal to 128. The transformation matrix in the method in embodiments of this application includes one transformation matrix.

It can be learned from FIG. 15 that performance of the method in embodiments of this application is similar to that of a CA-PAC solution, and is slightly better than performance of the CA-SCL algorithm.

When the transformation matrix may be two matrices, in embodiments of this application, simulation is performed on a CA-PAC, a CA-SCL, and the method in embodiments of this application, to compare performance thereof.

Figure 16:
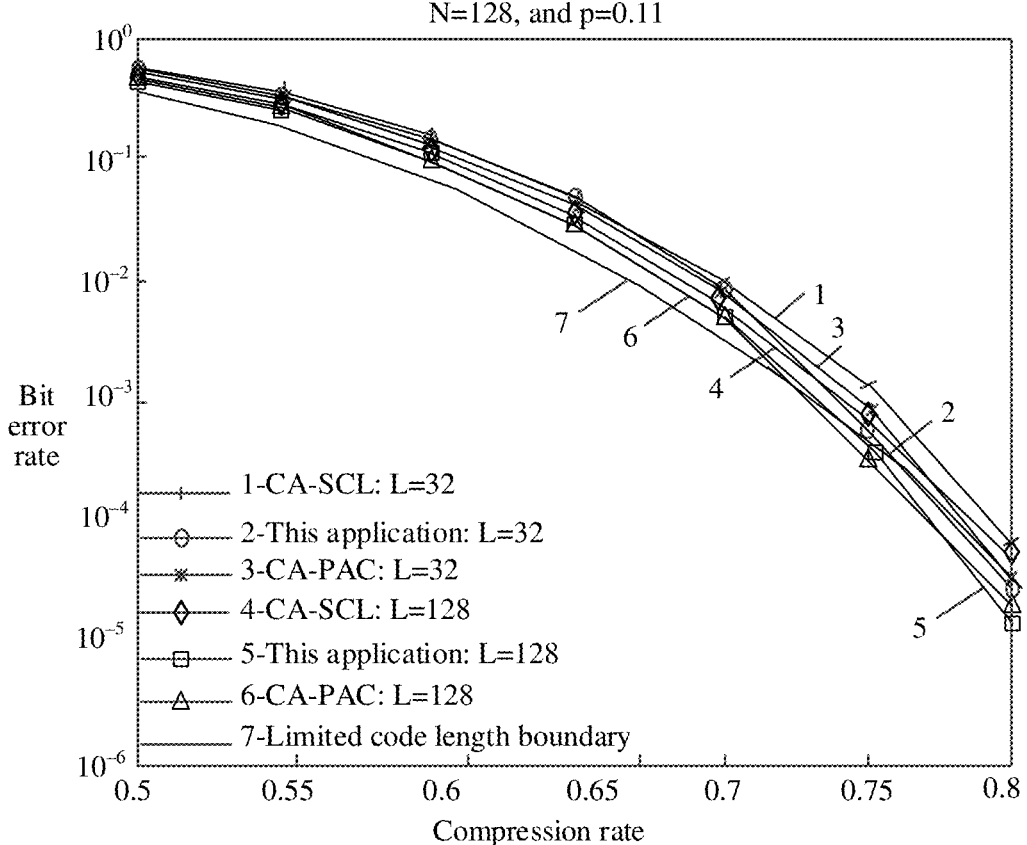
FIG. 16 is still another example diagram of simulation according to an embodiment of this application.

For example, FIG. 16 is still another diagram of simulation. As shown in FIG. 16, a length of a source bit sequence is 128, and the source bit sequence conforms to Ber(p) distribution, where p=0.11, and a quantity of CRC bits of the source bit sequence is 8. A line 1 represents a curve of bit error rates of a CA-SCL algorithm at different compression rates when a quantity L of paths is equal to 32. A line 2 represents a curve of bit error rates of the method in embodiments of this application at different compression rates when the quantity L of paths is equal to 32. A line 3 represents a curve of bit error rates of the CA-PAC at different compression rates when the quantity L of paths is equal to 32. A line 4 represents a curve of bit error rates of the CA-SCL algorithm at different compression rates when the quantity L of paths is equal to 128. A line 5 represents a curve of bit error rates of the method in embodiments of this application at different compression rates when the quantity L of paths is equal to 128. A line 6 represents a curve of bit error rates at different compression rates of the CA-PAC when the quantity L of paths is equal to 128. A line 7 represents a limited code length boundary. The transformation matrix in the method in embodiments of this application is two transformation matrix.

It can be learned from FIG. 16 that, when L=32, performance of the method in embodiments of this application is slightly better than that of a CA-PAC solution, and both the performance of the method in embodiments of this application and the performance of the CA-PAC solution are better than that of the CA-SCL algorithm. When L=128, the performance of the method in embodiments of this application is slightly better than that of the CA-PAC solution, and both the performance of the method in embodiments of this application and the performance of the CA-PAC solution are better than that of the CA-SCL algorithm. The limited code length boundary is exceeded in the method in embodiments of this application and the CA-PAC solution when the compression rate is greater than 0.75. In other words, a theoretical boundary of the limited code length is basically reached in both the method in embodiments of this application and the CA-PAC solution.

Figure 17:
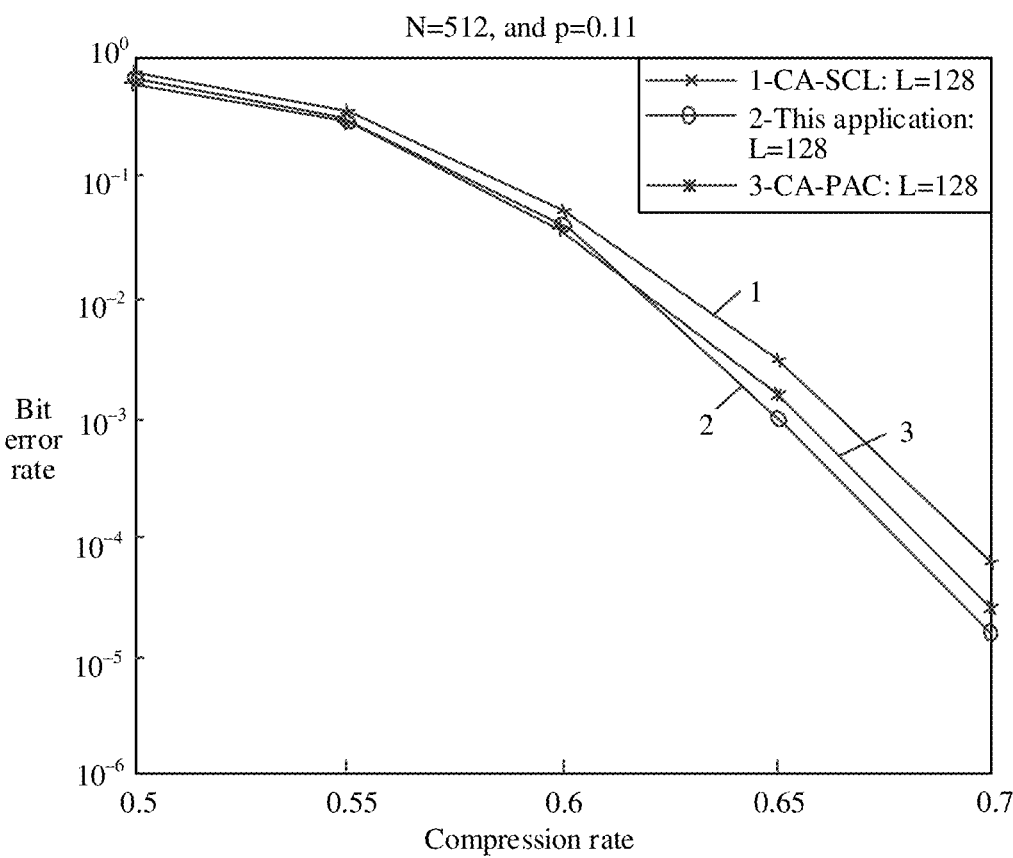
FIG. 17 is another example diagram of simulation according to an embodiment of this application.

For example, FIG. 17 is another diagram of simulation. As shown in FIG. 17, a length of a source bit sequence is 512, and the source bit sequence conforms to Ber(p) distribution, where p=0.11, and a quantity of CRC bits of the source bit sequence is 8. A line 1 represents a curve of bit error rates of a CA-SCL algorithm at different compression rates when a quantity L of paths is equal to 32. A line 2 represents a curve of bit error rates of the method in embodiments of this application at different compression rates when the quantity L of paths is equal to 32. A line 3 represents a curve of bit error rates of the CA-PAC at different compression rates when the quantity L of paths is equal to 32. The transformation matrix in the method in embodiments of this application is two transformation matrix.

It can be learned from FIG. 17 that the performance of the method in embodiments of this application is slightly better than that of the CA-PAC solution, and both the performance of the method in embodiments of this application and the performance of the CA-PAC solution are better than that of the CA-SCL algorithm.

The sequence numbers of the foregoing processes do not mean execution sequences. The execution sequences of the processes should be determined based on functions and internal logic of the processes, and should not constitute any limitation on implementation processes of embodiments of this application.

The foregoing describes in detail the encoding method based on a polar code in embodiments of this application with reference to FIG. 1 to FIG. 17. The following describes in detail an encoding apparatus based on a polar code in embodiments of this application with reference to FIG. 18 and FIG. 19.

Figure 18:
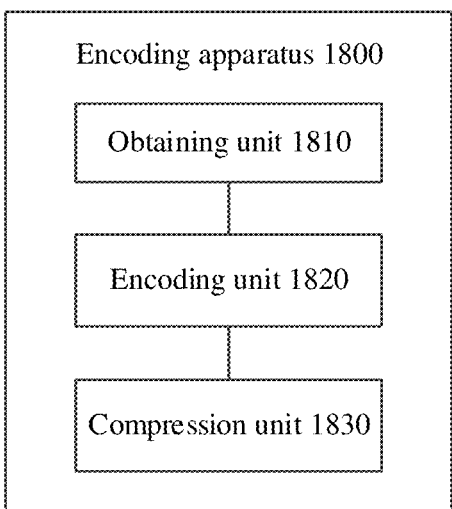
FIG. 18 is an example schematic block diagram of an encoding apparatus based on a polar code according to an embodiment of this application.

FIG. 18 is a schematic block diagram of an encoding apparatus 1800 based on polar code according to an embodiment of this application. The apparatus 1800 includes an obtaining unit 1810, an encoding unit 1820, and a compression unit 1830. The obtaining unit 1810 is configured to obtain a source bit sequence. The encoding unit 1820 is configured to encode the source bit sequence by using a polar code generation matrix that is based on sub-block column transformation, to obtain a first bit sequence, where the polar code generation matrix that is based on the sub-block column transformation is determined based on a first polar code generation matrix and a transformation matrix, and the transformation matrix may achieve an effect of performing sub-block column transformation on the first polar code generation matrix. The compression unit 1830 is configured to compress the first bit sequence, to obtain a compressed bit sequence.

Optionally, the encoding apparatus further includes a transform unit. The encoding unit 1830 is further configured to encode the source bit sequence based on the first polar code generation matrix, to obtain a second bit sequence. The transform unit is configured to transform the second bit sequence based on the transformation matrix, to obtain the first bit sequence.

Optionally, the transformation matrix P is expressed as the following formula:

$$P = \begin{bmatrix} (G_{N/2})_{permute} \cdot G_{N/2} & 0 \\ 0 & I \end{bmatrix}^{-1},$$

where $G_{N/2}$ is a second polar code generation matrix, N/2 represents that the second polar code generation matrix is N/2×N/2-dimensional, N represents that the first polar code generation matrix is N×N-dimensional, $(G_{N/2})$ permute is a matrix obtained through first preset column transformation of $G_{N/2}$, 0 is a zero matrix of N/2×N/2, and I is a unit matrix of N/2×N/2.

Optionally, the transformation matrix P is obtained by using a matrix S, P=G·S·G, G is the first polar code generation matrix, and the matrix S is expressed as the following formula:

$$S = \begin{bmatrix} G_{N/2} \cdot (G_{N/2})_{permute} & 0 \\ I - G_{N/2} \cdot (G_{N/2})_{permute} & I \end{bmatrix}^{-1},$$

where $G_{N/2}$ is the second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through first preset column transformation of $G_{N/2}$, 0 is the zero matrix of N/2×N/2, and I is the unit matrix of N/2×N/2.

Optionally, the transformation matrix includes a first transformation matrix and a second transformation matrix. The transform unit is further configured to: transform the second bit sequence based on the first transformation matrix, to obtain a third bit sequence; and transform the third bit sequence based on the second transformation matrix, to obtain the first bit sequence, where the first transformation matrix and the second transformation matrix may achieve the effect of performing sub-block column transformation on the first polar code generation matrix.

Optionally, the first transformation matrix $P_1$ is expressed as the following formula:

$$P_1 = \begin{bmatrix} A & 0 \\ 0 & B \end{bmatrix}^{-1},$$

where $$A = \begin{bmatrix} (G_{N/4})_{permute1} \cdot G_{N/4} & 0 \\ 0 & I \end{bmatrix},$$

$$B = \begin{bmatrix} (G_{N/4})_{permute2} \cdot G_{N/4} & 0 \\ 0 & I \end{bmatrix},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is a matrix obtained through second preset column transformation of $G_{N/4}$, $(G_{N/4})_{permute2}$ is a matrix obtained through third preset column transformation of $G_{N/4}$, 0 is a zero matrix, and I is a unit matrix of N/4×N/4.

Optionally, the second transformation matrix $P_2$ is expressed as the following formula:

$$P_2 = \begin{bmatrix} C & 0 \\ 0 & I \end{bmatrix}^{-1},$$

where $$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},$$

$$\begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, 0 is the zero matrix, and I is a unit matrix of N/2×N/2.

Optionally, the first transformation matrix $P_1$ and the second transformation matrix $P_2$ are obtained by using a matrix $S_1$ and a matrix $S_2$, $P_1 \cdot P_2 = G \cdot S \cdot S_2 \cdot G$, G is the first polar code generation matrix, and the matrix $S_1$ is expressed as the following formula:

$$S_1 = \begin{bmatrix} D & 0 \\ I - D & I \end{bmatrix}^{-1},$$

-continued where $$D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{premute1}$ is the matrix obtained through the second preset column transformation of $G_{N/4}$, $$G_{N/4}, \begin{bmatrix} (G_{N/4})_{permute1} & 0 \\ G_{N/4} & G_{N/4} \end{bmatrix}_{permute3}$$

is the matrix obtained through the fourth preset column transformation of $$\begin{bmatrix} (G_{N/4})_{permute1} & 0 \\ G_{N/4} & G_{N/4} \end{bmatrix},$$

0 is the zero matrix, and I is a unit matrix of N/2×N/2; and the matrix $S_2$ is expressed as the following formula:

$$S_2 = \begin{bmatrix} J & 0 \\ K & M \end{bmatrix}^{-1},$$

where $$J = \begin{bmatrix} G_{N/4} \cdot (G_{N/4})_{permute1} & 0 \\ I - G_{N/4} \cdot (G_{N/4})_{permute1} & I \end{bmatrix},$$

$$K = \begin{bmatrix} G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0 \end{bmatrix},$$

$$M = \begin{bmatrix} G_{N/4} \cdot (G_{N/4})_{permute2} & 0 \\ I - G_{N/4} \cdot (G_{N/4})_{permute2} & I \end{bmatrix},$$

and $(G_{N/4})_{permute2}$ is the matrix obtained through the third preset column transformation of $G_{N/4}$.

Optionally, the apparatus further includes a transform unit. The transform unit is configured to transform the source bit sequence based on the transformation matrix, to obtain a fourth bit sequence. The encoding unit 1830 is further configured to encode the fourth bit sequence based on the first polar code generation matrix, to obtain the first bit sequence.

Optionally, the transformation matrix S is expressed as the following formula:

$$S = \begin{bmatrix} G_{N/2} \cdot (G_{N/2})_{permute} & 0 \\ I - G_{N/2} \cdot (G_{N/2})_{permute} & I \end{bmatrix}^{-1},$$

where $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

Optionally, the transformation matrix S is obtained by using a matrix P, S=G·P·G, G is the first polar code generation matrix, and the matrix P is expressed as the following formula:

$$P = \begin{bmatrix} (G_{N/2})_{permute} \cdot G_{N/2} & 0 \\ 0 & I \end{bmatrix}^{-1},$$

where $G_{N/2}$ is the second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through the first preset column transformation of $G_{N/2}$, 0 is the zero matrix of N/2×N/2, and I is the unit matrix of N/2×N/2.

Optionally, the transformation matrix includes a third transformation matrix and a fourth transformation matrix. The transform unit is further configured to: transform the source bit sequence based on the third transformation matrix, to obtain a fifth bit sequence; and transform the fifth bit sequence based on the fourth transformation matrix, to obtain the fourth bit sequence, where the third transformation matrix and the fourth transformation matrix may achieve the effect of performing sub-block column transformation on the first polar code generation matrix.

Optionally, the third transformation matrix $S_1$ is expressed as the following formula:

$$S_1 = \begin{bmatrix} D & 0 \\ I-D & I \end{bmatrix}^{-1},$$

where $$D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{premute1}$ is a matrix obtained through second preset column transformation of $G_{N/4}$, $$\begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix},$$

0 is a zero matrix, and I is a unit matrix of N/2×N/2.

Optionally, the fourth transformation matrix $S_2$ is expressed as the following formula:

$$S_2 = \begin{bmatrix} J & 0 \\ K & M \end{bmatrix}^{-1},$$

where

-continued $$J = \begin{bmatrix} G_{N/4} \cdot (G_{N/4})_{permute1} & 0 \\ I - G_{N/4} \cdot (G_{N/4})_{permute1} & I \end{bmatrix},$$

$$K = \begin{bmatrix} G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0 \end{bmatrix},$$

$$M = \begin{bmatrix} G_{N/4} \cdot (G_{N/4})_{permute2} & 0 \\ I - G_{N/4} \cdot (G_{N,4})_{permute2} & I \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, $(G_{N/4})_{permute2}$ is a matrix obtained through third preset column transformation of $G_{N/4}$, 0 is the zero matrix, and I is a unit matrix of N/4×N/4.

Optionally, the third transformation matrix $S_1$ and the fourth transformation matrix $S_2$ are obtained by using a matrix $P_1$ and a matrix $P_2$, $S_1 \cdot S_2 = G \cdot P_1 \cdot P_2 \cdot G$, G is the first polar code generation matrix, and the matrix $P_1$ is expressed as the following formula:

$$P_1 = \begin{bmatrix} A & 0 \\ 0 & B \end{bmatrix}^{-1},$$

where $$A = \begin{bmatrix} (G_{N/4})_{permute1} \cdot G_{N/4} & 0 \\ 0 & I \end{bmatrix},$$

$$B = \begin{bmatrix} (G_{N/4})_{permute2} \cdot G_{N/4} & 0 \\ 0 & I \end{bmatrix},$$

$G_{N/4}$ is the third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through the second preset column transformation of $G_{N/4}$, $(G_{N/4})_{permute2}$ is the matrix obtained through the third preset column transformation of $G_{N/4}$, 0 is the zero matrix, and I is a unit matrix; and the matrix $P_2$ is expressed as the following formula:

$$P_2 = \begin{bmatrix} C & 0 \\ 0 & I \end{bmatrix}^{-1},$$

where $$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},$$

and $$\begin{bmatrix} (G_{N/4})_{permute1} & 0 \\ G_{N/4} & G_{N/4} \end{bmatrix}_{permute3}$$

is the matrix obtained through the fourth preset column transformation of $$\begin{bmatrix} (G_{N/4})_{permute1} & 0 \\ G_{N/4} & G_{N/4} \end{bmatrix}.$$

It should be understood that the encoding apparatus 1800 herein is embodied in a form of a functional unit. The term "unit" herein may refer to an application-specific integrated circuit (ASIC), an electronic circuit, a processor (for example, a shared processor, a dedicated processor, or a group processor) and a memory that are configured to execute one or more software or firmware programs, a merged logic circuit, and/or another appropriate component that supports the described function. In an optional example, a person skilled in the art may understand that the encoding apparatus 1800 may be specifically the sending device in the foregoing method embodiment, or a function of the sending device in the foregoing method embodiment may be integrated into the encoding apparatus 1800, and the encoding apparatus 1800 may be configured to perform procedures and/or steps corresponding to the sending device in the foregoing method embodiment.

The encoding apparatus 1800 has a function for implementing the corresponding steps performed by the sending device in the foregoing method embodiment. The function may be implemented by hardware, or may be implemented by hardware executing corresponding software. The hardware or the software includes one or more modules corresponding to the function.

In this embodiment, the encoding apparatus 1800 in FIG. 18 may alternatively be a chip or a chip system, for example, a system on chip (SoC).

Figure 19:
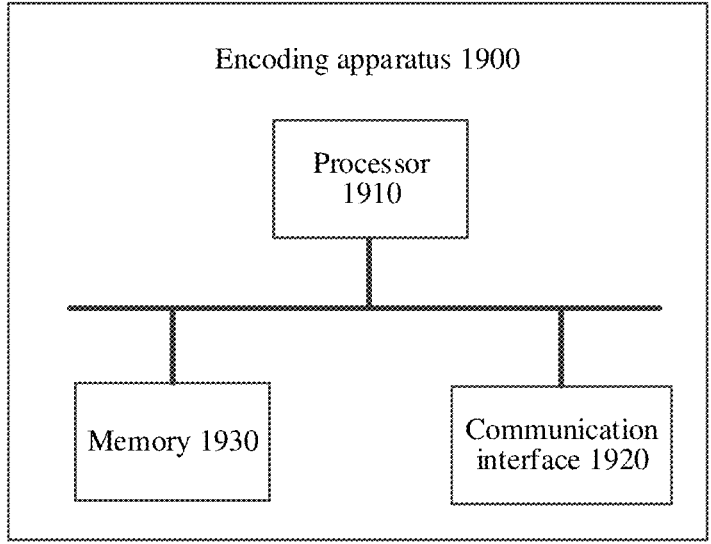
FIG. 19 is another example schematic block diagram of an encoding apparatus based on a polar code according to an embodiment of this application.

FIG. 19 is another schematic block diagram of an encoding apparatus 1900 based on a polar code according to an embodiment of this application. The encoding apparatus 1900 includes a processor 1910, a communication interface 1920, and a memory 1930. The processor 1910, the communication interface 1920, and the memory 1930 communicate with each other by using an internal connection path. The memory 1930 is configured to store instructions. The processor 1910 is configured to execute the instructions stored in the memory 1930, to control the communication interface 1920 to send a signal and/or receive a signal.

It should be understood that the encoding apparatus 1900 may be specifically the sending device in the foregoing method embodiment, or a function of the sending device in the foregoing method embodiment may be integrated into the encoding apparatus 1900, and the encoding apparatus 1900 may be configured to perform steps and/or procedures corresponding to the sending device in the foregoing method embodiment. Optionally, the memory 1930 may include a read-only memory and a random access memory, and provide instructions and data to the processor. A part of the memory may further include a non-volatile random access memory. For example, the memory may further store information of a device type. The processor 1910 may be configured to execute the instructions stored in the memory, and when the processor executes the instructions, the processor may perform steps and/or procedures corresponding to the sending device in the foregoing method embodiments.

It should be understood that, in embodiments of this application, the processor 1910 may be a central processing unit (CPU). Alternatively, the processor may be another general-purpose processor, a digital signal processor (DSP), an application-specific integrated circuit (ASIC), a field programmable gate array (FPGA) or another programmable logic device, a discrete gate or a transistor logic device, a discrete hardware component, or the like. The general-purpose processor may be a microprocessor, or the processor may be any conventional processor or the like.

In an implementation process, steps in the foregoing method may be implemented by using a hardware integrated logical circuit in the processor, or by using instructions in a form of software. The steps of the method disclosed with reference to embodiments of this application may be directly performed by a hardware processor, or may be performed by using a combination of hardware in the processor and a software module. A software module may be located in a mature storage medium in the art, such as a random access memory, a flash memory, a read-only memory, a programmable read-only memory, an electrically erasable programmable memory, or a register. The storage medium is located in the memory, and a processor reads instructions in the memory and completes the steps in the foregoing methods in combination with the hardware of the processor.

An embodiment of this application further provides a computer-readable storage medium. The computer-readable storage medium is configured to store a computer program, and the computer program is for implementing a method corresponding to the sending device in the foregoing embodiment.

An embodiment of this application further provides a chip system. The chip system is configured to support the sending device in the foregoing method embodiment in implementing a function shown in this embodiment.

An embodiment of this application provides a computer program product. The computer program product includes a computer program (which may also be referred to as code or instructions). When the computer program is run on a computer, the computer may perform the method corresponding to the sending device in the foregoing embodiment.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed operating process of the foregoing system, apparatus, and unit, refer to a corresponding process in the foregoing method embodiment.

In the several embodiments provided in this application, it should be understood that the disclosed system, apparatus, and method may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, in other words, may be located in one position, or may be distributed on a plurality of network units. Some or all of the units may be selected based on actual requirements to achieve the objectives of the solutions of embodiments.

In addition, functional units in embodiments of this application may be integrated into one processing unit, or each of the units may exist alone physically, or two or more units may be integrated into one unit.

When functions are implemented in the form of a software functional unit and sold or used as an independent product, the functions may be stored in a computer-readable storage medium. Based on such an understanding, the technical solutions of this application essentially, or a part contributing to conventional technology, or a part of the technical solutions may be implemented in a form of a software product. The software product is stored in a storage medium, and includes several instructions for instructing a computer device (which may be a personal computer, a server, or a receiving end) to perform all or a part of the steps of the methods described in embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely non-limiting examples of specific implementations and are not intended to limit the protection scope, which is intended to cover any variation or replacement readily determined by a person of ordinary skill in the art. Therefore, the claims shall define the protection scope.

The invention claimed is:

1. An encoding method based on a polar code, performed by at least one processor of an encoding apparatus, comprising:

obtaining a source bit sequence;

determining a polar code generation matrix by applying, to a sub-block of a first polar code generation matrix, a column permutation defined by a transformation matrix, encoding the source bit sequence by multiplying the source bit sequence with the polar code generation matrix, to obtain a first bit sequence including redundant bits; and compressing the first bit sequence by using the redundant bits and the fixed bits included in the first bit sequence, to obtain a compressed bit sequence.

2. The method according to claim 1, wherein the encoding the source bit sequence by multiplying the source bit sequence with the polar code generation matrix, to obtain a first bit sequence comprises:

encoding the source bit sequence based on the first polar code generation matrix, to obtain a second bit sequence; and transforming the second bit sequence based on the transformation matrix, to obtain the first bit sequence.

3. The method according to claim 2, wherein the transformation matrix P is expressed as the following formula:

$$P = \begin{bmatrix} (G_{N/2})_{permute} \cdot G_{N/2} & 0 \\ 0 & I \end{bmatrix}^{-1},$$

wherein $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

4. The method according to claim 2, wherein the transformation matrix P is obtained by using a matrix S, P=G·S·G, G is the first polar code generation matrix, and the matrix S is expressed as the following formula:

$$
S = \begin{bmatrix} G_{N/2} \cdot (G_{N/2})_{permute} & 0 \\ I - G_{N/2} \cdot (G_{N/2})_{permute} & I \end{bmatrix}^{-1},
$$

wherein $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through first preset column transformation of $G_{N/2}$, 0 is a zero matrix of N/2×N/2, and I is a unit matrix of N/2×N/2.

5. The method according to claim 2, wherein the transformation matrix comprises a first transformation matrix and a second transformation matrix; and the transforming the second bit sequence based on the transformation matrix, to obtain the first bit sequence comprises:

transforming the second bit sequence based on the first transformation matrix, to obtain a third bit sequence; and transforming the third bit sequence based on the second transformation matrix, to obtain the first bit sequence.

6. The method according to claim 5, wherein the first transformation matrix P is expressed as the following formula:

$$
P_1 = \begin{bmatrix} A & 0 \\ 0 & B \end{bmatrix}^{-1},
$$

wherein $$
A = \begin{bmatrix} (G_{N/4})_{permute1} \cdot G_{N/4} & 0 \\ 0 & I \end{bmatrix},
$$

$$
B = \begin{bmatrix} (G_{N/4})_{permute2} \cdot G_{N/4} & 0 \\ 0 & I \end{bmatrix},
$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is a matrix obtained through second preset column transformation of $G_{N/4}$, $(G_{N/4})_{permute2}$ is a matrix obtained through third preset column transformation of $G_{N/4}$, 0 is a zero matrix, and I is a unit matrix of N/4×N/4.

7. The method according to claim 5, wherein the second transformation matrix $P_2$ is expressed as the following formula:

$$
P_2 = \begin{bmatrix} C & 0 \\ 0 & I \end{bmatrix}^{-1},
$$

wherein $$
C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},
$$

$$
\begin{bmatrix} (G_{N/4})_{permute1} & 0 \\ G_{N/4} & G_{N/4} \end{bmatrix}_{permute3}
$$

is a matrix obtained through fourth preset column transformation of $$
\begin{bmatrix} (G_{N/4})_{permute1} & 0 \\ G_{N/4} & G_{N/4} \end{bmatrix},
$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through a second preset column transformation of $G_{N/4}$, 0 is a zero matrix, and I is a unit matrix of N/2×N/2.

8. The method according to claim 5, wherein the first transformation matrix $P_1$ and the second transformation matrix $P_2$ are obtained by using a matrix $S_1$ and a matrix $S_2$, $P_1 \cdot P_2 = G \cdot S_1 \cdot S_2 \cdot G$, G is the first polar code generation matrix, and the matrix $S_1$ is expressed as the following formula:

$$
S_1 = \begin{bmatrix} D & 0 \\ I - D & I \end{bmatrix}^{-1},
$$

wherein $$
D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},
$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{premute1}$ is the matrix obtained through a second preset column transformation of $G_{N/4}$, $$
\begin{bmatrix} (G_{N/4})_{permute1} & 0 \\ G_{N/4} & G_{N/4} \end{bmatrix}_{permute3}
$$

is the matrix obtained through a fourth preset column transformation of $$
\begin{bmatrix} (G_{N/4})_{permute1} & 0 \\ G_{N/4} & G_{N/4} \end{bmatrix},
$$

0 is a zero matrix, and I is a unit matrix; and the matrix $S_2$ is expressed as the following formula:

$$
S_2 = \begin{bmatrix} J & 0 \\ K & M \end{bmatrix}^{-1},
$$

wherein $$
J = \begin{bmatrix} G_{N/4} \cdot (G_{N/4})_{permute1} & 0 \\ I - G_{N/4} \cdot (G_{N/4})_{permute1} & I \end{bmatrix},
$$

$$
K = \begin{bmatrix} G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0 \end{bmatrix},
$$

$$
M = \begin{bmatrix} G_{N/4} \cdot (G_{N/4})_{permute2} & 0 \\ I - G_{N/4} \cdot (G_{N/4})_{permute2} & I \end{bmatrix},
$$

and $(G_{N/4})_{permute2}$ is the matrix obtained through a third preset column transformation of $G_{N/4}$.

9. The method according to claim 1, wherein the encoding the source bit sequence by multiplying the source bit sequence with the polar code generation matrix, to obtain a first bit sequence comprises:

transforming the source bit sequence based on the transformation matrix, to obtain a fourth bit sequence; and encoding the fourth bit sequence based on the first polar code generation matrix, to obtain the first bit sequence.

10. The method according to claim 9, wherein the transformation matrix S is expressed as the following formula:

$$S = \begin{bmatrix} G_{N/2} \cdot (G_{N/2})_{permute} & 0 \\ I - G_{N/2} \cdot (G_{N/2})_{permute} & I \end{bmatrix}^{-1},$$

wherein $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

11. The method according to claim 9, wherein the transformation matrix S is obtained by using a matrix P, S=G·P·G, G is the first polar code generation matrix, and the matrix P is expressed as the following formula:

$$P = \begin{bmatrix} (G_{N/2})_{permute} \cdot G_{N/2} & 0 \\ 0 & I \end{bmatrix}^{-1},$$

wherein $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through first preset column transformation of $G_{N/2}$, 0 is a zero matrix of N/2×N/2, and I is a unit matrix of N/2×N/2.

12. The method according to claim 9, wherein the transformation matrix comprises a third transformation matrix and a fourth transformation matrix; and the transforming the source bit sequence based on the transformation matrix, to obtain a fourth bit sequence comprises:

transforming the source bit sequence based on the third transformation matrix, to obtain a fifth bit sequence; and transforming the fifth bit sequence based on the fourth transformation matrix, to obtain the fourth bit sequence.

13. The method according to claim 12, wherein the third transformation matrix $S_1$ is expressed as the following formula:

$$S_1 = \begin{bmatrix} D & 0 \\ I - D & I \end{bmatrix}^{-1},$$

wherein $$D = \begin{bmatrix} (G_{N/4})_{permute1} & 0 \\ G_{N/4} & G_{N/4} \end{bmatrix}^{-1} \cdot \begin{bmatrix} (G_{N/4})_{permute1} & 0 \\ G_{N/4} & G_{N/4} \end{bmatrix}_{permute3},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{premute1}$ is a matrix obtained through second preset column transformation of $G_{N/4}$, $$\begin{bmatrix} (G_{N/4})_{permute1} & 0 \\ G_{N/4} & G_{N/4} \end{bmatrix}_{permute3}$$

is a matrix obtained through fourth preset column transformation of $$\begin{bmatrix} (G_{N/4})_{permute1} & 0 \\ G_{N/4} & G_{N/4} \end{bmatrix},$$

0 is a zero matrix, and I is a unit matrix of N/2×N/2.

14. The method according to claim 12, wherein the fourth transformation matrix $S_2$ is expressed as the following formula:

$$S_2 = \begin{bmatrix} J & 0 \\ K & M \end{bmatrix}^{-1},$$

wherein $$J = \begin{bmatrix} G_{N/4} \cdot (G_{N/4})_{permute1} & 0 \\ I - G_{N/4} \cdot (G_{N/4})_{permute1} & I \end{bmatrix},$$

$$K = \begin{bmatrix} G_{N/4} \cdot (G_{N/4})_{permute2} - G_{N/4} \cdot (G_{N/4})_{permute1} & 0 \\ G_{N/4} \cdot (G_{N/4})_{permute1} - G_{N/4} \cdot (G_{N/4})_{permute2} & 0 \end{bmatrix},$$

$$M = \begin{bmatrix} G_{N/4} \cdot (G_{N/4})_{permute2} & 0 \\ I - G_{N/4} \cdot (G_{N/4})_{permute2} & I \end{bmatrix},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through a second preset column transformation of $G_{N/4}$, $(G_{N/4})_{permute2}$ is a matrix obtained through third preset column transformation of $G_{N/4}$, 0 is a zero matrix, and I is a unit matrix of N/4×N/4.

15. The method according to claim 12, wherein the third transformation matrix $S_1$ and the fourth transformation matrix $S_2$ are obtained by using a matrix $P_1$ and a matrix $P_2$, $S_1 \cdot S_2 = G \cdot P_1 \cdot P_2 \cdot G$, G is the first polar code generation matrix, and the matrix $P_1$ is expressed as the following formula:

$$P_1 = \begin{bmatrix} A & 0 \\ 0 & B \end{bmatrix}^{-1},$$

wherein $$A = \begin{bmatrix} (G_{N/4})_{permute1} \cdot G_{N/4} & 0 \\ 0 & I \end{bmatrix},$$

$$B = \begin{bmatrix} (G_{N/4})_{permute2} & G_{N/4} & 0 \\ 0 & I \end{bmatrix},$$

$G_{N/4}$ is a third polar code generation matrix, N/4 represents that the third polar code generation matrix is N/4×N/4-dimensional, N represents that the first polar code generation matrix is N×N-dimensional, $(G_{N/4})_{permute1}$ is the matrix obtained through a second preset column transformation of $G_{N/4}$, $(G_{N/4})_{permute2}$ is the matrix obtained through a third preset column transformation of $G_{N/4}$, 0 is a zero matrix, and I is a unit matrix; and the matrix $P_2$ is expressed as the following formula:

$$P_2 = \begin{bmatrix} C & 0 \\ 0 & I \end{bmatrix}^{-1},$$

wherein $$C = \begin{bmatrix} (G_{N/4})_{permute1} & 0 \\ G_{N/4} & G_{N/4} \end{bmatrix}_{permute3} \cdot \begin{bmatrix} (G_{N/4})_{permute1} & 0 \\ G_{N/4} & G_{N/4} \end{bmatrix}^{-1},$$

and $$\begin{bmatrix} (G_{N/4})_{permute1} & 0 \\ G_{N/4} & G_{N/4} \end{bmatrix}_{permute3}$$

is the matrix obtained through a fourth preset column transformation of $$\begin{bmatrix} (G_{N/4})_{permute1} & 0 \\ G_{N/4} & G_{N/4} \end{bmatrix}.$$

16. An encoding apparatus based on a polar code, comprising at least one processor and a memory storing instructions that, when executed by the at least one processor, cause the encoding apparatus to perform operations comprising:

obtaining a source bit sequence;

determining a polar code generation matrix by applying to a sub-block of a first polar code generation matrix, a column permutation defined by a transformation matrix;

encoding the source bit sequence by multiplying the source bit sequence with the polar code generation matrix, to obtain a first bit sequence including redundant bits and fixed bits; and compressing the first bit sequence by using the redundant bits and the fixed bits included in the first bit sequence, to obtain a compressed bit sequence.

17. The encoding apparatus according to claim 16, wherein the encoding the source bit sequence by multiplying the source bit sequence with the polar code generation matrix, to obtain a first bit sequence comprises:

encoding the source bit sequence based on the first polar code generation matrix, to obtain a second bit sequence; and transforming the second bit sequence based on the transformation matrix, to obtain the first bit sequence.

18. The encoding apparatus according to claim 17, wherein the transformation matrix P is expressed as the following formula:

$$P = \begin{bmatrix} (G_{N/2})_{permute} \cdot G_{N/2} & 0 \\ 0 & I \end{bmatrix}^{-1},$$

wherein $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is a matrix obtained through first preset column transformation of $G_{N/2}$, 0 is a zero matrix of N/2×N/2, and I is a unit matrix of N/2×N/2.

19. The encoding apparatus according to claim 17, wherein the transformation matrix P is obtained by using a matrix S, P=G·S·G, G is the first polar code generation matrix, and the matrix S is expressed as the following formula:

$$S = \begin{bmatrix} G_{N/2} \cdot (G_{N/2})_{permute} & 0 \\ I - G_{N/2} \cdot (G_{N/2})_{permute} & I \end{bmatrix}^{-1},$$

wherein $G_{N/2}$ is a second polar code generation matrix, N/2 represents that the second polar code generation matrix is N/2×N/2-dimensional, N represents that the first polar code generation matrix is N×N-dimensional, $(G_{N/2})_{permute}$ is the matrix obtained through first preset column transformation of $G_{N/2}$, 0 is a zero matrix of N/2×N/2, and I is a unit matrix of N/2×N/2.

20. The encoding apparatus according to claim 17, wherein the transformation matrix comprises a first transformation matrix and a second transformation matrix; and the transforming the second bit sequence based on the transformation matrix, to obtain the first bit sequence comprises:

transforming the second bit sequence based on the first transformation matrix, to obtain a third bit sequence; and transforming the third bit sequence based on the second transformation matrix, to obtain the first bit sequence.

\* \* \* \* \*